(12) United States Patent
Li

(10) Patent No.: US 10,976,618 B2
(45) Date of Patent: Apr. 13, 2021

(54) TRANSPARENT DISPLAY PANEL AND TRANSPARENT DISPLAY DEVICE

(71) Applicant: SHANGHAI TIANMA MICRO-ELECTRONICS CO., LTD., Shanghai (CN)

(72) Inventor: Jialing Li, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 199 days.

(21) Appl. No.: 16/384,961

(22) Filed: Apr. 16, 2019

(65) Prior Publication Data

US 2019/0250450 A1 Aug. 15, 2019

(30) Foreign Application Priority Data

Dec. 29, 2018 (CN) .......................... 201811646047.X

(51) Int. Cl.
G02F 1/1347 (2006.01)
G02F 1/13 (2006.01)

(52) U.S. Cl.
CPC ........ *G02F 1/13471* (2013.01); *G02F 1/1306* (2013.01)

(58) Field of Classification Search
CPC .......................... G02F 1/13471; G02F 1/1306
USPC .......................................................... 349/74
See application file for complete search history.

(56) References Cited

U.S. PATENT DOCUMENTS

| 2014/0009720 A1 | 1/2014 | Huang |
| 2014/0307430 A1* | 10/2014 | Lo ........................... G09F 13/00 362/231 |
| 2019/0129257 A1 | 5/2019 | Wang et al. |

FOREIGN PATENT DOCUMENTS

| CN | 101557533 A | 10/2009 |
| CN | 103440822 A | 12/2013 |
| CN | 103531100 A | 1/2014 |
| CN | 104317060 A | 1/2015 |
| CN | 20465124 U | 9/2015 |
| CN | 204651324 U * | 9/2015 |

(Continued)

OTHER PUBLICATIONS

Office Action of Chinese Patent Application No. 201811646047.X.

*Primary Examiner* — Nathanael R Briggs
*Assistant Examiner* — William D Peterson
(74) *Attorney, Agent, or Firm* — Kilpatrick Townsend & Stockton, LLP

(57) ABSTRACT

A transparent display panel and a transparent display device are provided. The transparent display panel includes multiple display regions arranged in an array along a first direction and a second direction. Each of the display regions includes a non-transmissive region, a first light transmissive region and a second light transmissive region. In a same display region, the non-transmissive region and the first light transmissive region are arranged sequentially in the first direction, and the non-transmissive region and the second light transmissive region are arranged sequentially in the second direction. Lengths of the display regions in the first direction change non-periodically among multiple display regions arranged along the first direction; and/or, the first light transmissive regions of any two adjacent display regions are misaligned in the first direction among multiple display regions arranged along the second direction.

20 Claims, 20 Drawing Sheets

(56) References Cited

FOREIGN PATENT DOCUMENTS

| | | |
|---|---|---|
| CN | 106773379 A | 5/2017 |
| CN | 107703689 A | 2/2018 |

* cited by examiner

TRANSPARENT DISPLAY PANEL AND TRANSPARENT DISPLAY DEVICE

CROSS REFERENCE TO RELATED APPLICATION

The present application claims the priority to Chinese Patent Application No. 201811646047.X titled "TRANSPARENT DISPLAY PANEL AND TRANSPARENT DISPLAY DEVICE", filed on Dec. 29, 2018 with the Chinese Patent Office, which is incorporated herein by reference in its entirety.

FIELD

The present disclosure relates to the field of display, and in particular to a transparent display panel and a transparent display device.

BACKGROUND

With the development of the display technology, various new display technologies continuously emerge. In which, transparent display technology has attracted more and more attention. A transparent display device generally refers to a display device that can display images in a transparent display mode so that a viewer can see both a display image of the display device and a background of the display device. However, image ghosting often occurs in the conventional transparent display devices, resulting in image blurring and affecting the user experience.

SUMMARY

In view of this, a transparent display panel and a transparent display device are provided according to the present disclosure, to solve the problem of image ghosting in the conventional transparent display device.

A transparent display panel includes multiple display regions arranged in an array along a first direction and a second direction. The first direction and the second direction intersect with each other and are both parallel to a plane in which the transparent display panel is located.

Each of the display regions includes a non-transmissive region, a first light transmissive region and a second light transmissive region. In a same display region, the non-transmissive region and the first light transmissive region are arranged sequentially in the first direction, and the non-transmissive region and the second transparent region are arranged sequentially in the second direction.

Lengths of the display regions in the first direction change non-periodically among multiple display regions arranged along the first direction;

and/or, the first light transmissive regions of any two adjacent display regions are misaligned in the first direction among multiple display regions arranged along the second direction.

A transparent display device includes the transparent display panel described above.

In the transparent display panel and the transparent display device provided in the present disclosure, lengths of the display regions in the first direction change non-periodically among multiple display regions arranged along the first direction; and/or, the first light transmissive regions of any two adjacent display regions are misaligned in the first direction among multiple display regions arranged along the second direction, thereby eliminating or reducing the diffraction of the light, eliminating or reducing the ghosting of images, and thus improving the definition of the displayed images and optimizing the user experience.

BRIEF DESCRIPTION OF THE DRAWING

Embodiments of the present disclosure in the drawings referred to describe the embodiments will be briefly described hereinafter. Apparently, the drawings in the following description illustrate embodiments of the present disclosure.

DETAILED DESCRIPTION OF THE EMBODIMENTS

Figure 1:
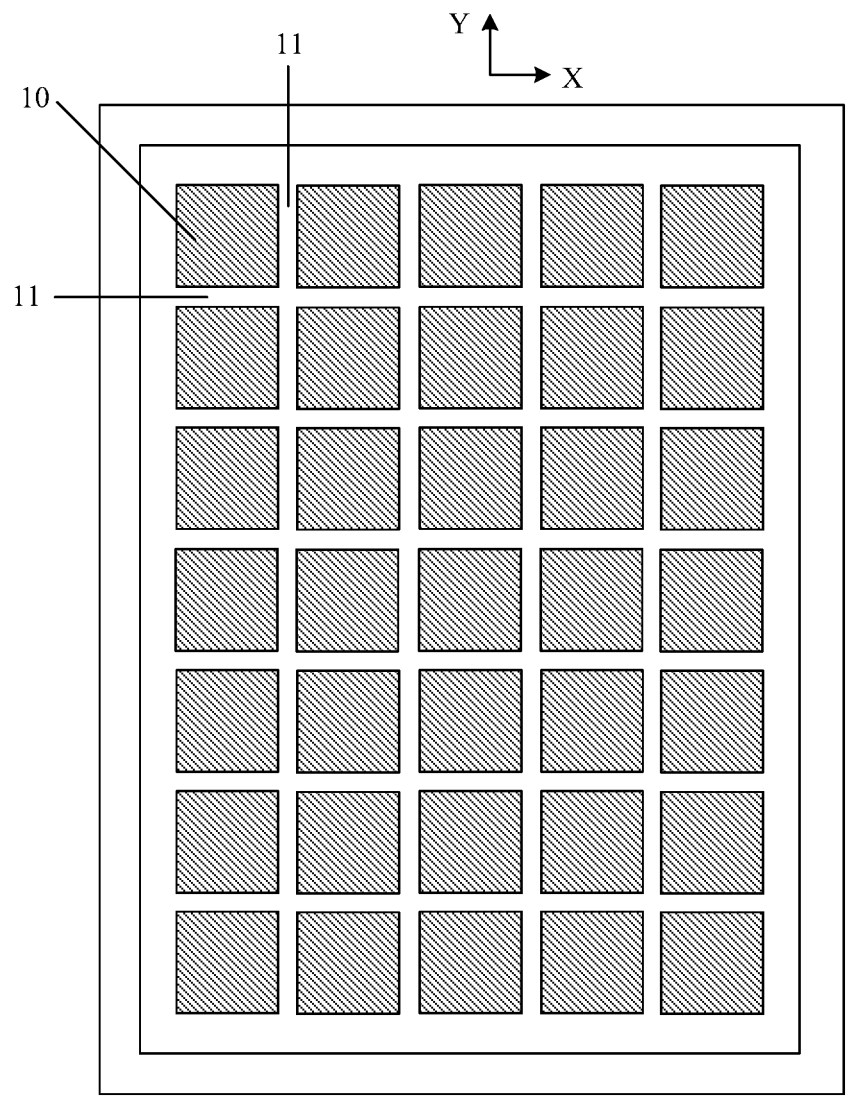
FIG. 1 is a schematic structural diagram of a conventional transparent display panel.

As described in the background, image ghosting occurs in the conventional transparent display devices. It is found by the inventor that the main reason for this problem is that a distant object is composed of point light sources, the light emitted from different point light sources becomes coherent light when reaching the transparent display device, and the transmissive regions and the non-transmissive regions in the transparent display panel are periodically arranged. As shown in FIG. 1, FIG. 1 is a schematic structural diagram of a conventional transparent display panel. Since the transmissive regions 10 and the non-transmissive regions 11 arranged periodically along the direction X and the direction Y form a similar grating structure, diffraction of the transmitted background light occurs, resulting in ghosting of displayed images.

On basis of this, a transparent display panel is provided in the present disclosure to overcome the above problems existing in the conventional technology. The transparent display panel includes multiple display regions arranged in an array along a first direction and a second direction. The first direction and the second direction intersect with each other and are both parallel to a plane in which the transparent display panel is located.

Each of the display regions includes a non-transmissive region, a first light transmissive region and a second light transmissive region. In a same display region, the non-transmissive region and the first light transmissive region are arranged sequentially in the first direction, and the non-transmissive region and the second light transmissive region are arranged sequentially in the second direction.

Lengths of the display regions in the first direction change non-periodically among multiple display regions arranged along the first direction; and/or, the first light transmissive regions of any two adjacent display regions are misaligned in the first direction among multiple display regions arranged along the second direction.

In the transparent display panel provided in the present disclosure, lengths of the display regions in the first direction change non-periodically among multiple display regions arranged along the first direction; and/or, the first light transmissive regions of any two adjacent display regions are misaligned in the first direction among multiple display regions arranged along the second direction, thereby eliminating or reducing the diffraction of the light in the first direction, eliminating or reducing the ghosting of images in the first direction, and thus improving the definition of the displayed images and optimizing the user experience.

Embodiments of the present disclosure are described hereinafter in conjunction with the drawings of the embodiments of the present disclosure. It is apparent that the embodiments described in the following are only some embodiments of the present disclosure, rather than all embodiments.

Figure 2:
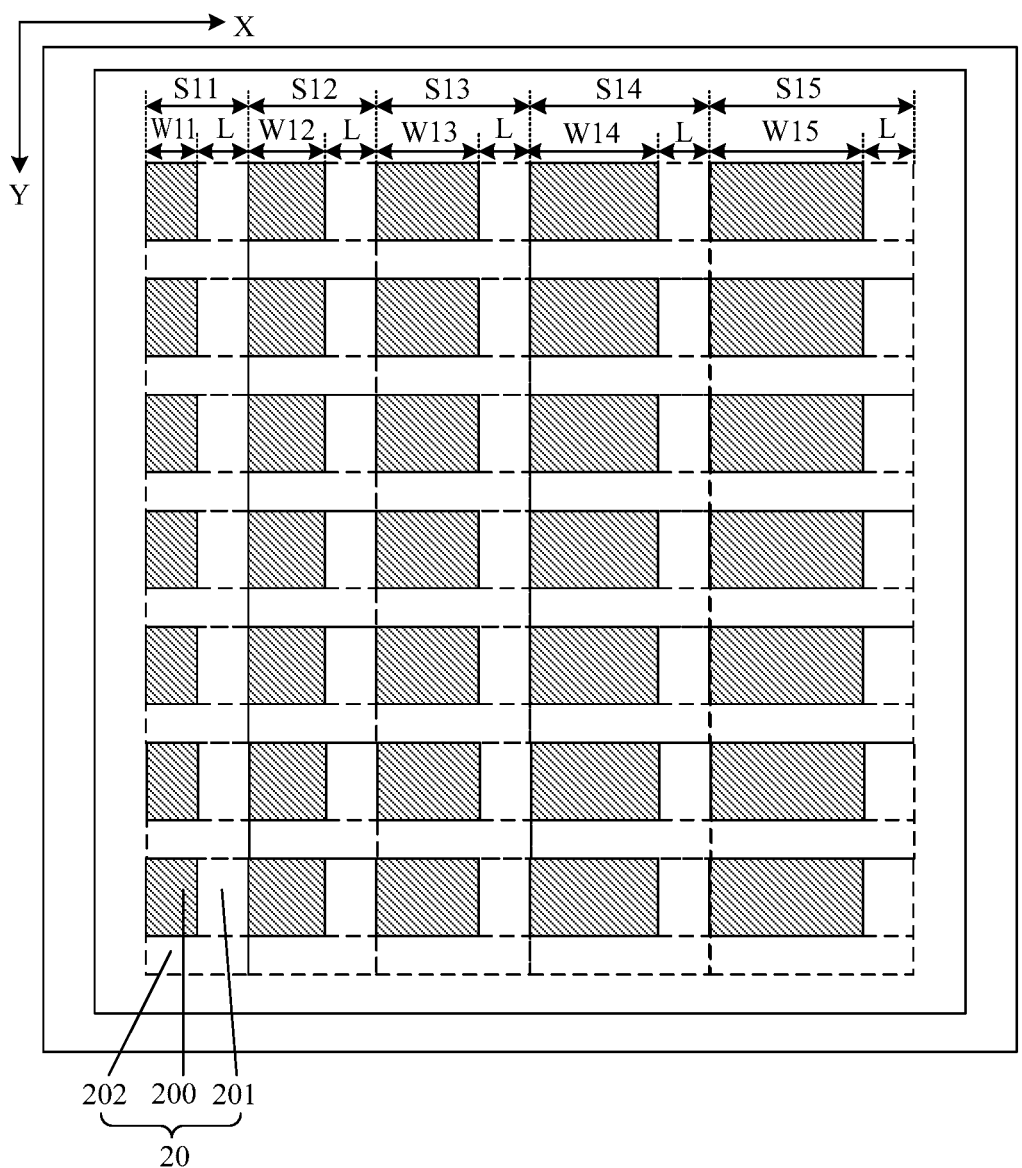
FIG. 2 is a schematic top view structural diagram of a transparent display panel according to an embodiment of the present disclosure.

A transparent display panel provided in an embodiment of the present disclosure is shown in FIG. 2. FIG. 2 is a schematic top view structural diagram of a transparent display panel according to an embodiment of the present disclosure. The transparent display panel includes multiple display regions 20 arranged in an array along a first direction X and a second direction Y. The first direction X and the second direction Y intersect with each other and are both parallel to a plane in which the transparent display panel is located.

In an embodiment, as shown in FIG. 2, the first direction X is perpendicular to the second direction Y, the first direction X is parallel to one side of the transparent display panel, and the second direction Y is parallel to another side of the transparent display panel. In addition, a plane formed by the first direction X and the second direction Y is parallel to the plane in which the transparent display panel is located.

It should be noted that, in FIG. 2, a case that the shape of the display region 20 is square or approximately square is taken as an example for illustration, and the present disclosure is not limited to this. That is, in the embodiment of the present disclosure, the display region 20 may have a square shape, an approximately square shape, a parallelogram shape, a triangle shape, a trapezoid shape, etc. Further, the first light transmissive region 201 and the second light transmissive region 202 may also have a square shape, an approximately square shape, a parallelogram shape, a triangle shape, a trapezoid shape, etc.

As shown in FIG. 2, each display region 20 includes a non-transmissive region 200, a first light transmissive region 201, and a second light transmissive region 202. Further, in a same display region 20, the non-transmissive region 200 and the first light transmissive region 201 are arranged sequentially in the first direction X, and the non-transmissive region 200 and the second light transmissive region 202 are arranged sequentially in the second direction Y. That is, the non-transmissive regions 200 and the first light transmissive regions 201 are alternately arranged among multiple display regions 20 arranged sequentially in the first direction X, and the non-transmissive regions 200 and the second light transmissive regions 202 are alternately arranged among multiple display regions 20 arranged sequentially in the second direction Y.

It should be noted that the non-transmissive region in the embodiment of the present disclosure refers to a region of the pixel unit having a display image or a region of a pixel driving circuit, in which the background light cannot transmit a back surface of the transparent display panel or the background light has a small transmittance. The transmissive region refers to a region of a pixel unit having no display image or a region of a pixel driving circuit, in which the background light can transmit the back surface of the transparent display panel or the background light has a large transmittance.

In an embodiment of the present disclosure, lengths of the display regions 20 in the first direction X change non-periodically among multiple display regions 20 arranged along the first direction X; and/or, the first light transmissive regions 201 of any two adjacent display regions 20 are misaligned in the first direction X among multiple display regions 20 arranged along the second direction Y.

According to the definition of a grating, an optical device composed of multiple parallel slits having an equal width and an equal spacing is called a grating. On basis of this, in a case that lengths of the display regions 20 in the first direction X change non-periodically among multiple display regions 20 arranged along the first direction X, the multiple first light transmissive regions 201 are not equal in width and/or equal in spacing. Therefore, the multiple columns of display regions 20 arranged along the first direction X cannot form a grating, thereby eliminating or reducing the diffraction of light in the first direction X, and eliminating or reducing the ghosting of images in the first direction X, and thus improving the definition of the displayed images and optimizing the user experience.

In a case that the first light transmissive regions 201 of any two adjacent display regions 20 are misaligned in the first direction X among multiple display regions 20 arranged along the second direction Y, the multiple first light transmissive regions 201 in a same column cannot form a strip-shaped light transmissive region, and the strip-shaped light transmissive regions in different columns cannot form parallel slits. Therefore, the multiple columns of display regions 20 arranged along the first direction X cannot form a grating, thereby eliminating or reducing the diffraction of light, eliminating or reducing the ghosting of images (especially eliminating or reducing the diffraction of the light in the first direction X, eliminating or reducing the ghost of images in the first direction X), and thus improving the definition of the displayed images and optimizing the user experience.

It should be noted that, it is assumed that the first direction is the horizontal direction and the second direction is the vertical direction in the embodiment of the present disclosure. However, the present disclosure is not limited to this. In other embodiments, the first direction may also be the vertical direction, and the second direction may also be the horizontal direction.

In the embodiment of the present disclosure, lengths of the display regions 20 in the first direction X changing non-periodically among multiple display regions 20 arranged along the first direction X, includes that: the lengths of the display regions 20 in the first direction X are not equal to each other among multiple display regions 20 arranged along the first direction X, such as $S11 \neq S12 \neq S13 \neq S14 \neq S15$.

Since the length of a display region 20 in the first direction X is equal to a sum of the length of a non-transmissive region 200 in the first direction X and the length of a first light transmissive region 201 in the first direction X, lengths of the display regions 20 in the first direction X changing non-periodically among multiple display regions 20 arranged along the first direction X, includes that: among multiple display regions 20 arranged along the first direction X, the lengths of the non-transmissive regions 200 in the first direction X change non-periodically, and/or, the lengths of the first light transmissive regions 201 in the first direction X change non-periodically.

In a case that the lengths of the non-transmissive regions 200 in the first direction X change non-periodically, and/or the lengths of the first light transmissive regions 201 in the first direction X change non-periodically among multiple display regions 20 arranged along the first direction X, the lengths of display regions 20 in the first direction X change non-periodically, such that multiple columns of display regions 20 arranged along the first direction X cannot form a grating, thereby eliminating or reducing the diffraction of light in the first direction X, and eliminating or reducing the ghosting of images in the first direction X.

As shown in FIG. 2, in any row of display regions 20, the lengths L of the first light transmissive regions 201 in the first direction X keep constant, that is, the lengths L of any two of the first light transmissive regions 201 in the first direction X are equal to each other;

and the lengths of the non-transmissive regions 200 in the first direction X change non-periodically. The lengths of the non-transmissive regions 200 in the first direction X changing non-periodically includes that: the lengths of the non-transmissive regions 200 in the first direction X are not equal to each other, that is, $W11 \neq W12 \neq W13 \neq W14 \neq W15$.

Since the lengths of the non-transmissive regions 200 in the first direction X are not equal to each other in any row of the display regions 20, multiple first light transmissive regions 201 are not equally spaced, such that the multiple columns of display regions 20 arranged along the first direction X cannot form a grating, thereby eliminating or reducing the diffraction of light in the first direction X, and eliminating or reducing the ghosting of images in the first direction X.

Figure 3:
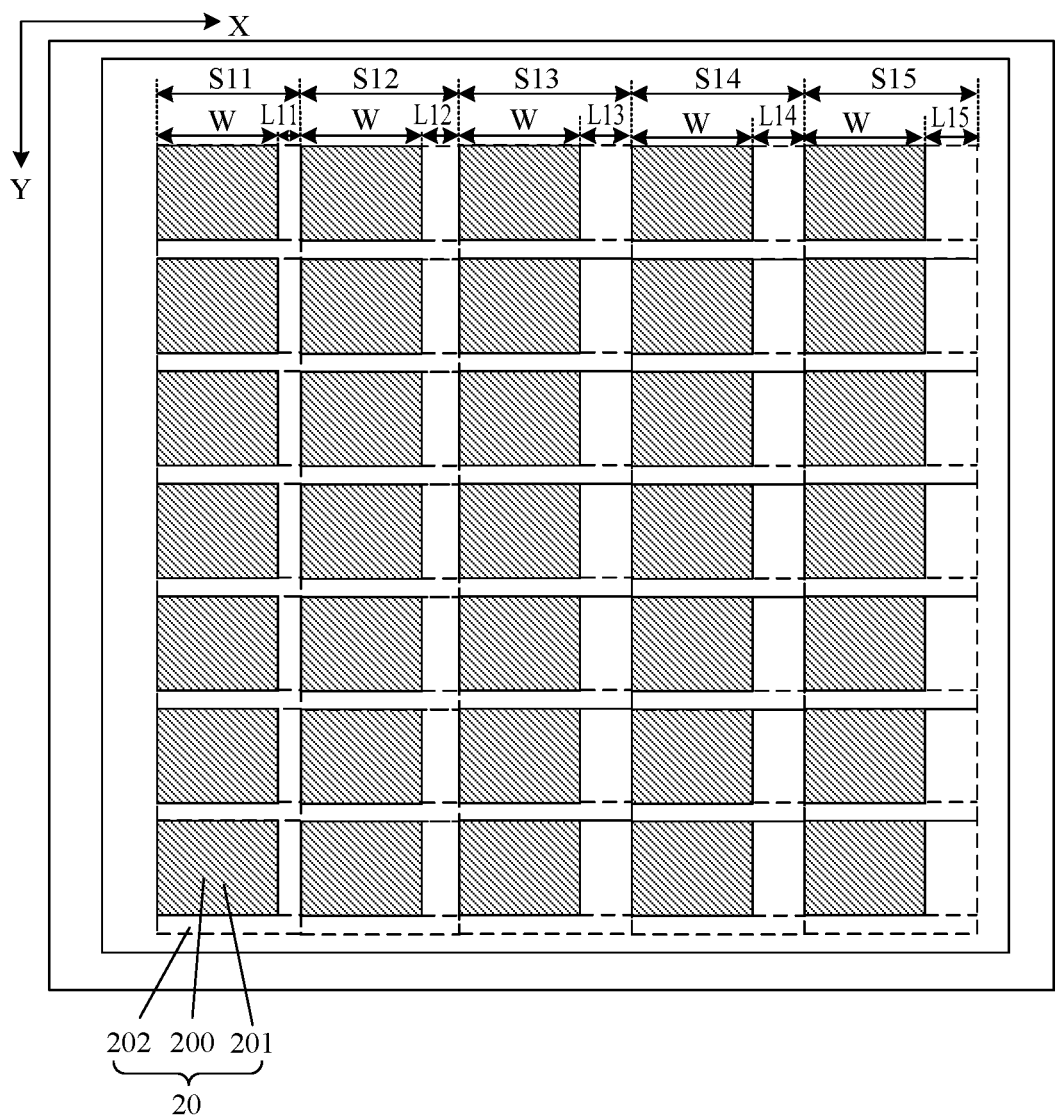
FIG. 3 is a schematic top view structural diagram of a transparent display panel according to another embodiment of the present disclosure.

As shown in FIG. 3, FIG. 3 is a schematic top view structural diagram of a transparent display panel according to another embodiment of the present disclosure. In any row of display regions 20, the lengths W of the non-transmissive regions 200 in the first direction X are equal to each other, and the lengths of the first light transmissive regions 201 in the first direction X change non-periodically. The lengths of the first light transmissive regions 201 in the first direction X changing non-periodically includes that: the lengths of the first light transmissive regions 201 in the first direction X are not equal to each other, that is, $L11 \neq L12 \neq L13 \neq L14 \neq L15$.

Since the lengths of the first light transmissive regions 201 in the first direction X are not equal to each other in any row of the display regions 20, multiple first light transmissive regions 201 are not equal in width, such that the multiple columns of display regions 20 arranged along the first direction X cannot form a grating, thereby eliminating or reducing the diffraction of light in the first direction X, and eliminating or reducing the ghosting of images in the first direction X.

Moreover, since the lengths W of the non-transmissive regions 200 in the first direction X are equal to each other, spatial arrangements of the pixel unit and the pixel driving circuit and other components are consistent, such that a density of wires in one pixel driving circuit is consistent with a density of wires in other pixel driving circuits, thereby not only facilitating the fabrication and arrangement of the wires, but also avoiding differences in display brightness caused by differences in coupling of wires.

Figure 4:
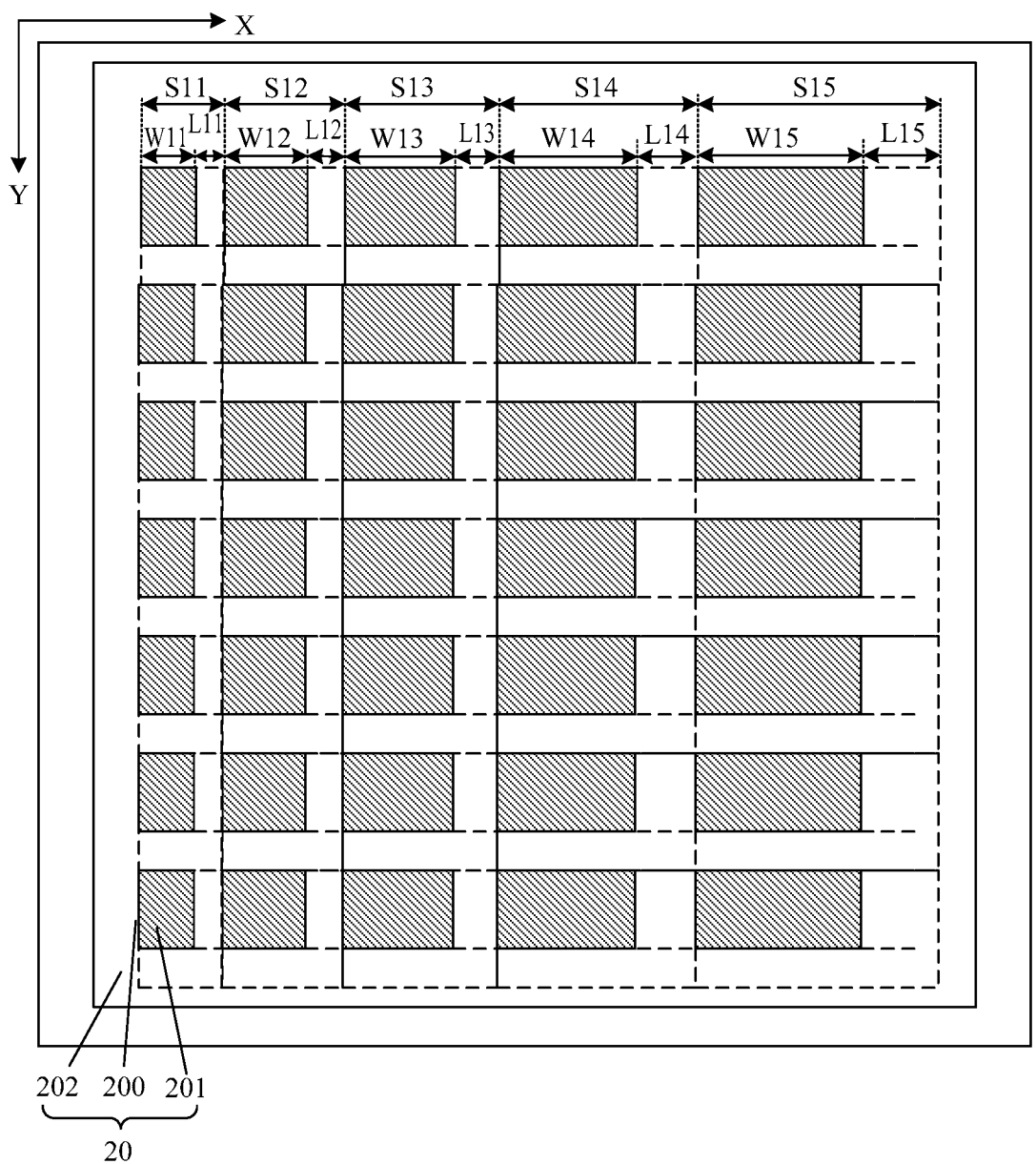
FIG. 4 is a schematic top view structural diagram of a transparent display panel according to another embodiment of the present disclosure.

As shown in FIG. 4, FIG. 4 is a schematic top view structural diagram of a transparent display panel according to another embodiment of the present disclosure. In any row of display regions 20, the lengths of the non-transmissive regions 200 in the first direction X change non-periodically, and the lengths of the first light transmissive regions 201 in the first direction X change non-periodically. That is to say, the lengths of the non-transmissive regions 200 in the first direction X are not equal to each other, that is, $W11 \neq W12 \neq W13 \neq W14 \neq W15$. Moreover, the lengths of the first light transmissive regions 201 in the first direction X are not equal to each other, that is, $L11 \neq L12 \neq L13 \neq L14 \neq L15$.

In any row of the display regions 20, since the lengths of the non-transmissive regions 200 in the first direction X are not equal to each other, and the lengths of the first light transmissive regions 201 in the first direction X are not equal to each other, multiple first light transmissive regions 201 are neither equally spaced, nor equal in width, such that the multiple columns of display regions 20 arranged along the first direction X cannot form a grating, thereby eliminating or reducing the diffraction of light in the first direction X, and eliminating or reducing the ghosting of images in the first direction X.

It should be noted that, in the embodiment of the present disclosure, in a case that the lengths of the non-transmissive regions 200 in the first direction X are not equal to each other, a tolerance of lengths of any two of the non-transmissive regions 200 in the first direction X is greater than an average of lengths of all the non-transmissive regions 200 of a same row in the first direction X, among the row of the non-transmissive regions 200 arranged along the first direction X. Further, in an embodiment, in a row of non-transmissive regions 200 arranged along the first direction X, a tolerance of the lengths of any two non-transmissive regions 200 in the first direction X is greater than 10% of the average length of all the non-transmissive regions 200 of a same row in the first direction X. Therefore, the diffraction of the light in the first direction X can be eliminated or reduced to the largest extent by limiting the length variations of the non-transmissive regions 200 in the first direction X.

In a case that the lengths of the first light transmissive regions 201 in the first direction X are not equal to each other, a tolerance of lengths of any two of the first light transmissive regions 201 in the first direction X is greater than an average of lengths of all the first light transmissive regions 201 of a same row in the first direction X, among a row of the display regions 20 arranged along the first direction X. Further, in an embodiment, among a row of display regions 20 arranged along the first direction X, a tolerance of the lengths of any two of the first light transmissive regions 201 in the first direction X is greater than 10% of the average length of all the first light transmissive regions 201 of a same row in the first direction X. Therefore, the diffraction of the light in the first direction X can be eliminated or reduced to the largest extent by limiting the length variations of the first light transmissive regions 201 in the first direction X.

In another embodiment of the present disclosure, in a case that the lengths of the display regions 20 in the first direction X are equal to each other among multiple display regions 20 arranged along the first direction X, such as S11=S12=S13=S14=S15=S, the first light transmissive regions 201 of any two adjacent display regions 20 are misaligned in the first direction X among multiple display regions 20 arranged along the second direction Y, thereby avoiding the formation of a grating in the first direction X.

Figure 5:
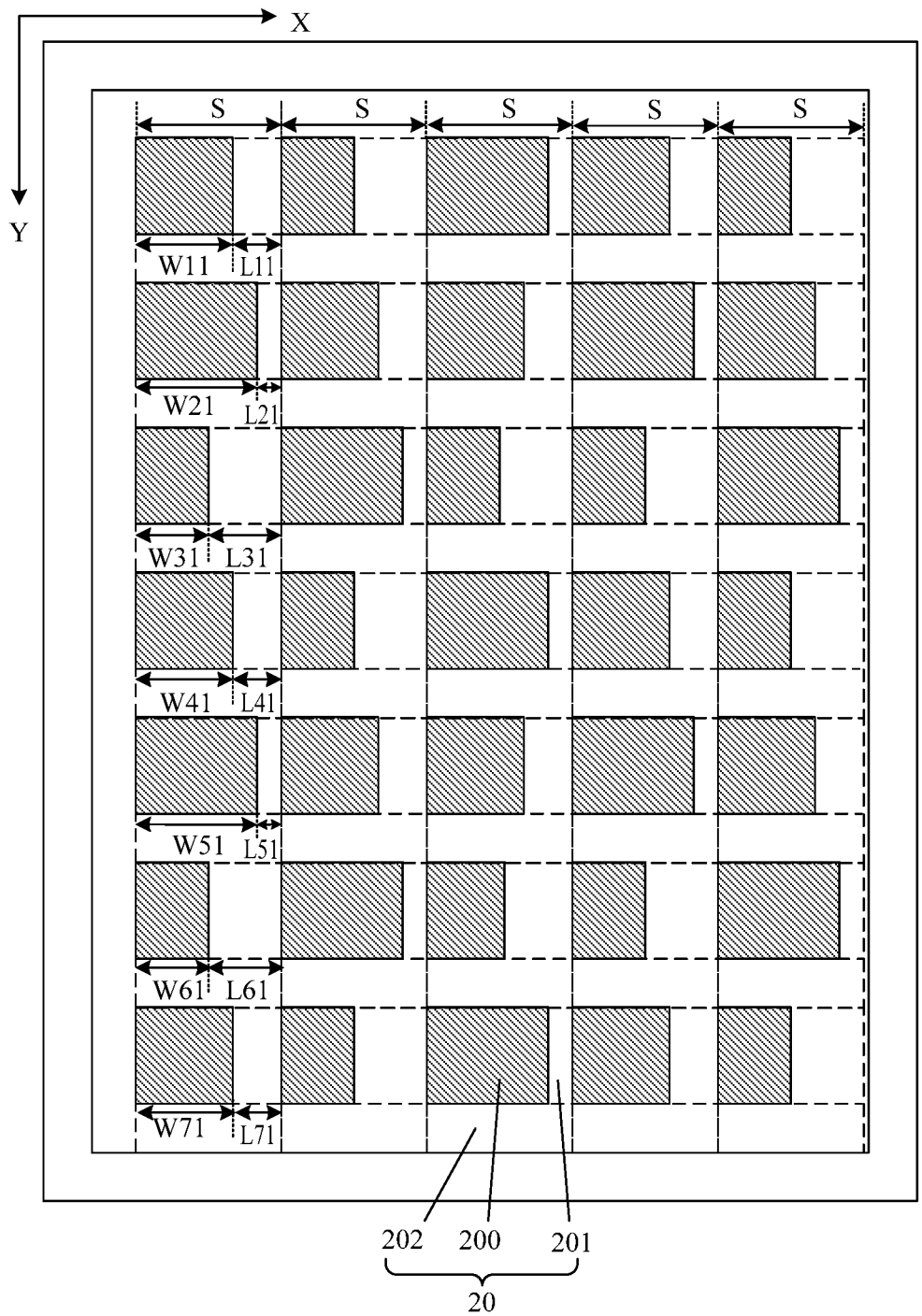
FIG. 5 is a schematic top view structural diagram of a transparent display panel according to another embodiment of the present disclosure.

As shown in FIG. 5, FIG. 5 is a schematic top view structural diagram of a transparent display panel according to another embodiment of the present disclosure. In any row of the display regions 20, the lengths of the display regions 20 in the first direction X keep constant, that is, S11=S12=S13=S14=S15=S. However, since the first light transmissive regions 201 of any two adjacent display regions 20 are misaligned in the first direction X among any column of the display regions 20, the multiple first light transmissive regions 201 in a same column cannot form a strip-shaped light transmissive region, and the strip-shaped light transmissive regions in different columns cannot form parallel slits. Therefore, the multiple columns of the display regions 20 arranged along the first direction X cannot form a grating, thereby eliminating or reducing the diffraction of light in the first direction X, and eliminating or reducing the ghosting of images in the first direction X.

In another embodiment of the present disclosure, in a case that the lengths of the display regions 20 in the first direction X change non-periodically among multiple display regions 20 arranged along the first direction X, such as S11≠S12≠S13~S14≠S15, the first light transmissive regions 201 of any two adjacent display regions 20 are misaligned in the first direction X among multiple display regions 20 arranged along the second direction Y, thereby avoiding the formation of a grating in the first direction X.

Figure 6:
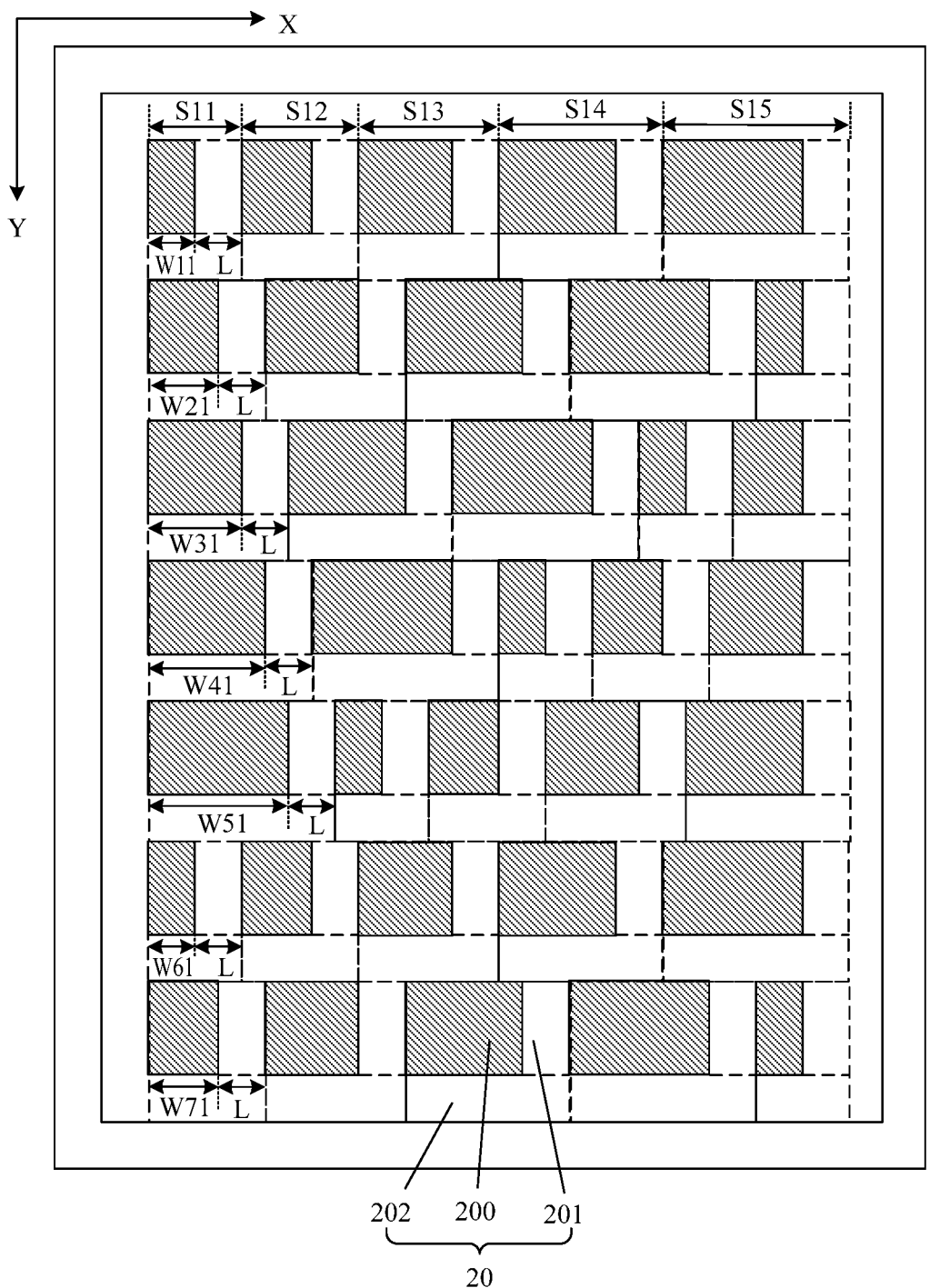
FIG. 6 is a schematic top view structural diagram of a transparent display panel according to another embodiment of the present disclosure.

As shown in FIG. 6, FIG. 6 is a schematic top view structural diagram of a transparent display panel according to another embodiment of the present disclosure. In any row of the display regions 20, the lengths of the display regions 20 in the first direction X change non-periodically, that is, S11≠S12≠S13≠S14≠S15. Moreover, the first light transmissive regions 201 of any two adjacent display regions 20 are misaligned in the first direction X among any column of the display regions 20, thereby avoiding the formation of multiple parallel slits with equal widths and equal spacing, preventing the multiple first light transmissive regions 201 in a same column from forming a strip-shaped light transmissive region, preventing the strip-shaped light transmissive regions in different columns from forming parallel slits, and thus avoiding the formation of a grating in the first direction X to the largest extent.

In any one of the above embodiments, the first light transmissive regions 201 of any two adjacent display regions 20 being misaligned in the first direction X among multiple display regions 20 arranged along the second direction Y includes that: among the multiple display regions 20 arranged along the second direction Y, the lengths of the first light transmissive regions 201 in the first direction X change non-periodically, and/or the lengths of the non-transmissive regions 200 in the first direction X change non-periodically.

In a case that the lengths of the first light transmissive regions 201 in the first direction X change non-periodically, and/or the lengths of the non-transmissive regions 200 in the first direction X change non-periodically among multiple display regions 20 arranged along the second direction Y, the first light transmissive regions 201 of any two adjacent display regions 20 are misaligned in the first direction X among multiple display regions 20 arranged along the second direction Y, such that the multiple first light transmissive regions 201 of a same column cannot form a strip-shaped light transmissive region, and the strip-shaped light transmissive regions in different columns cannot form parallel slits. Therefore, the multiple columns of display regions 20 arranged along the first direction X cannot form a grating, thereby eliminating or reducing the diffraction of light in the first direction X, and eliminating or reducing the ghosting of images in the first direction X.

As shown in FIG. 5, in any column of the display regions 20, the lengths of the non-transmissive regions 200 in the first direction X change non-periodically, and the lengths of the first light transmissive regions 201 in the first direction X change non-periodically, that is, the lengths of the non-transmissive regions 200 in the first direction X are not equal to each other, that is, W11≠W21≠W31≠W41≠W51≠W61≠W71. Moreover, the lengths of the first light transmissive regions 201 in the first direction X are not equal to each other, that is, L11≠L21≠L31≠L41≠L51≠L61≠L71.

In any column of the display regions 20, since the lengths of the non-transmissive regions 200 in the first direction X are not equal to each other, and the lengths of the first light transmissive regions 201 in the first direction X are not equal to each other, the first light transmissive regions 201 of any two adjacent display regions 20 are misaligned in the first direction X among any column of the display regions 20, such that the multiple columns of display regions 20 arranged along the first direction X cannot from a grating, thereby eliminating or reducing the diffraction of light in the first direction X.

As shown in FIG. 6, in any column of the display regions 20, the lengths L of the first light transmissive regions 201 in the first direction X are equal to each other, and the lengths of the non-transmissive regions 200 in the first direction X change non-periodically, that is, the lengths of the non-transmissive regions 200 in the first direction X are not equal to each other, that is, $W11 \neq W21 \neq W31 \neq W41 \neq W51 \neq W61 \neq W71$.

In any column of the display regions 20, since the lengths of the non-transmissive regions 200 in the first direction X are not equal to each other, the first light transmissive regions 201 of any two adjacent display regions 20 are misaligned in the first direction X among any column of the display regions 20, such that the multiple columns of display regions 20 arranged along the first direction X cannot form a grating, thereby eliminating or reducing the diffraction of light in the first direction X.

Figure 7:
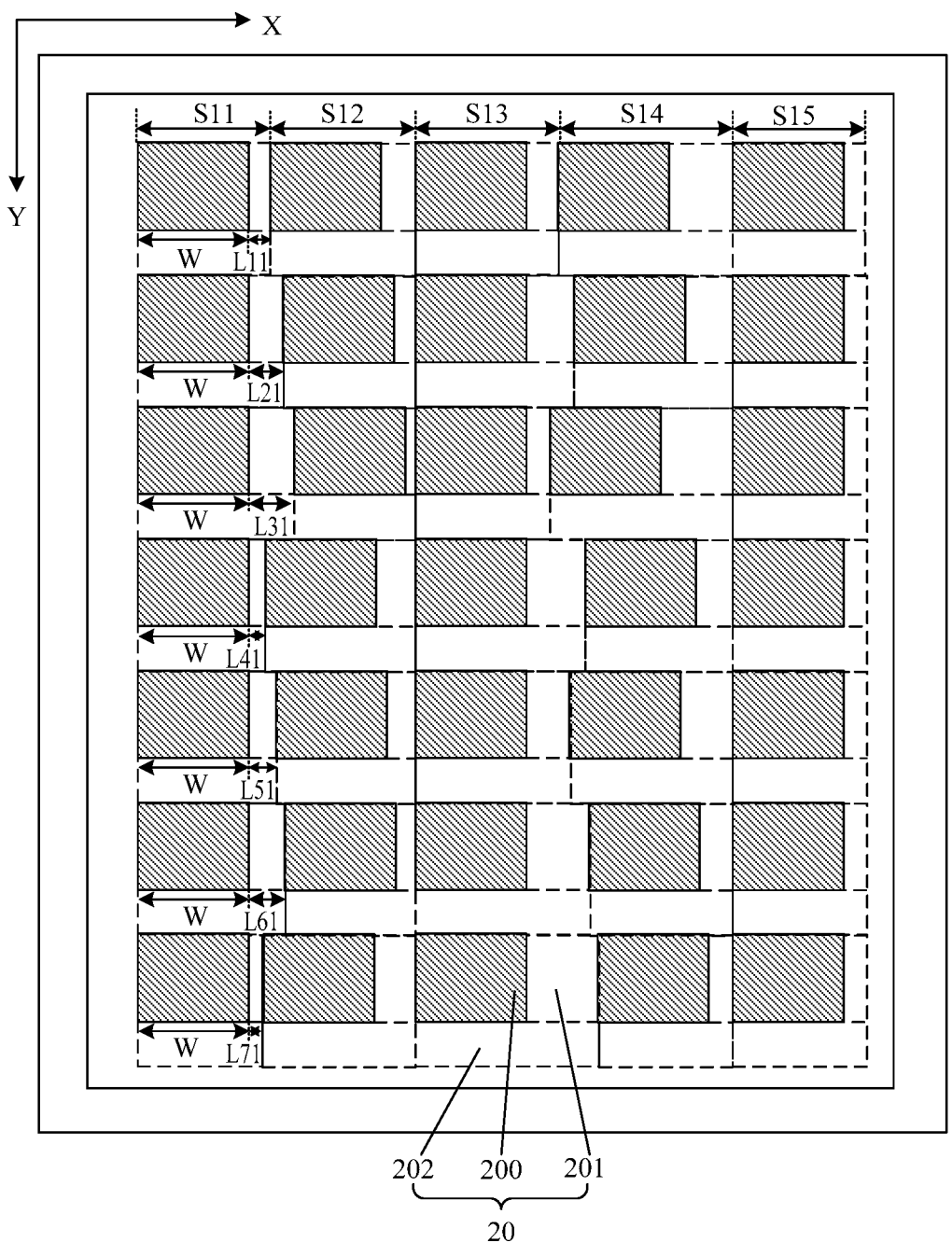
FIG. 7 is a schematic top view structural diagram of a transparent display panel according to another embodiment of the present disclosure.

As shown in FIG. 7, FIG. 7 is a schematic top view structural diagram of a transparent display panel according to another embodiment of the present disclosure. In any column of display regions 20, the lengths W of the non-transmissive regions 200 in the first direction X are equal to each other, and the lengths of the first light transmissive regions 201 in the first direction X change non-periodically, that is, the lengths of the first light transmissive regions 201 in the first direction X are not equal to each other, that is, $L11 \neq L21 \neq L31 \neq L41 \neq L51 \neq L61 \neq L71$.

In any column of the display regions 20, since the lengths of the first light transmissive regions 200 in the first direction X are not equal to each other, the first light transmissive regions 201 of any two adjacent display regions 20 are misaligned in the first direction X among any column of the display regions 20, such that the multiple columns of display regions 20 arranged along the first direction X cannot form a grating, thereby eliminating or reducing the diffraction of light in the first direction X.

It should be noted that, in a case that the lengths of the non-transmissive regions 200 in the first direction X are not equal to each other, a tolerance of lengths of any two of the non-transmissive regions 200 in the first direction X is greater than an average of lengths of all the non-transmissive regions 200 of a same column in the first direction X, among the column of the non-transmissive regions 200 arranged along the second direction Y. Further, in an embodiment, in a column of non-transmissive regions 200 arranged along the second direction Y, a tolerance of the lengths of any two non-transmissive regions 200 in the first direction X is greater than 10% of the average length of all the non-transmissive regions 200 of a same column in the first direction X. Therefore, the diffraction of the light in the first direction X can be eliminated or reduced to the largest extent by limiting the length variations of the non-transmissive regions 200 in the first direction X.

In a case that the lengths of the first light transmissive regions 201 in the first direction X are not equal to each other, a tolerance of lengths of any two of the first light transmissive regions 201 in the first direction X is greater than an average of lengths of all the first light transmissive regions 201 of a same column in the first direction X, among the column of the display regions 20 arranged along the second direction Y. Further, in an embodiment, in a column of display regions 20 arranged along the second direction Y, a tolerance of the lengths of any two of the first light transmissive regions 201 in the first direction X is greater than 10% of the average length of all the first light transmissive regions 201 of a same column in the first direction X. Therefore, the diffraction of the light in the first direction X can be eliminated or reduced to the largest extent by limiting the length variations of the first light transmissive regions 201 in the first direction X.

On the basis of any one of the above embodiments, lengths of the display regions 20 in the second direction Y change non-periodically among multiple display regions 20 arranged along the second direction Y; and/or, the second light transmissive regions 202 of any two adjacent display regions 20 are misaligned in the second direction Y among multiple display regions 20 arranged along the first direction X.

In a case that lengths of the display regions 20 in the second direction Y change non-periodically among multiple display regions 20 arranged along the second direction Y, multiple second light transmissive regions 202 are not equal in width and/or equal in spacing. Therefore, the multiple rows of display regions 20 arranged along the second direction Y cannot form a grating, thereby eliminating or reducing the diffraction of light in the second direction Y, eliminating or reducing the ghosting of images in the second direction Y, and thus improving the definition of the displayed images and optimizing the user experience.

In a case that the second light transmissive regions 202 of any two adjacent display regions 20 are misaligned in the second direction Y among multiple display regions 20 arranged along the first direction X, the multiple second light transmissive regions 202 in a same row cannot form a strip-shaped light transmissive region, and the strip-shaped light transmissive regions in different rows cannot form parallel slits. Therefore, the multiple rows of display regions 20 arranged along the second direction Y cannot form a grating, thereby eliminating or reducing the diffraction of light in the second direction Y, eliminating or reducing the ghosting of images in the second direction Y, and thus improving the definition of the displayed images and optimizing the user experience.

That is, in the multiple display regions 20 arranged along the first direction X, the lengths of the display regions 20 in the first direction X change non-periodically; and/or in the multiple display regions 20 arranged along the second direction Y, the first light transmissive regions 201 of any two adjacent display regions 20 are misaligned in the first direction X. Moreover, in the multiple display regions 20 arranged along the second direction Y, lengths of the display regions 20 in the second direction Y change non-periodically; and/or in the multiple display regions 20 arranged along the first direction X, the second light transmissive regions 202 of any two adjacent display regions 20 are misaligned in the second direction Y, such that multiple columns of the display regions 20 arranged along the first direction X cannot form a grating, and multiple rows of display regions 20 arranged along the second direction Y cannot form a grating either, thereby eliminating or reducing the diffraction of light in the first direction X and the second direction Y, eliminating or reducing the ghosting of images in the first direction X and the second direction Y, and thus further improving the definition of the displayed images and optimizing the user experience.

In the embodiment of the present disclosure, the lengths of the display regions 20 in the second direction Y changing non-periodically among multiple display regions 20 arranged along the second direction Y, includes that: the lengths of the display regions 20 in the second direction Y are not equal to each other among multiple display regions 20 arranged along the second direction Y, such as $D11 \neq D21 \neq D31 \neq D41 \neq D51$.

Since the length of a display region 20 in the second direction Y is equal to a sum of the length of a non-transmissive region 200 in the second direction Y and the length of a second light transmissive region 202 in the second direction Y, lengths of the display regions 20 in the second direction Y changing non-periodically among multiple display regions 20 arranged along the second direction Y, includes that: in multiple display regions 20 arranged along the second direction Y, the lengths of the non-transmissive regions 200 in the second direction Y change non-periodically, and/or, the lengths of the second light transmissive regions 202 in the second direction Y change non-periodically.

In a case that the lengths of the non-transmissive regions 200 in the second direction Y change non-periodically, and/or the lengths of the second light transmissive regions 202 in the second direction Y change non-periodically among any column of the display regions 20, the lengths of the display regions 20 in the second direction Y change non-periodically among any column of the display regions 20, such that multiple rows of display regions 20 arranged along the second direction Y cannot form a grating, thereby eliminating or reducing the diffraction of light in the second direction Y, and eliminating or reducing the ghosting of images in the second direction Y.

Figure 8:
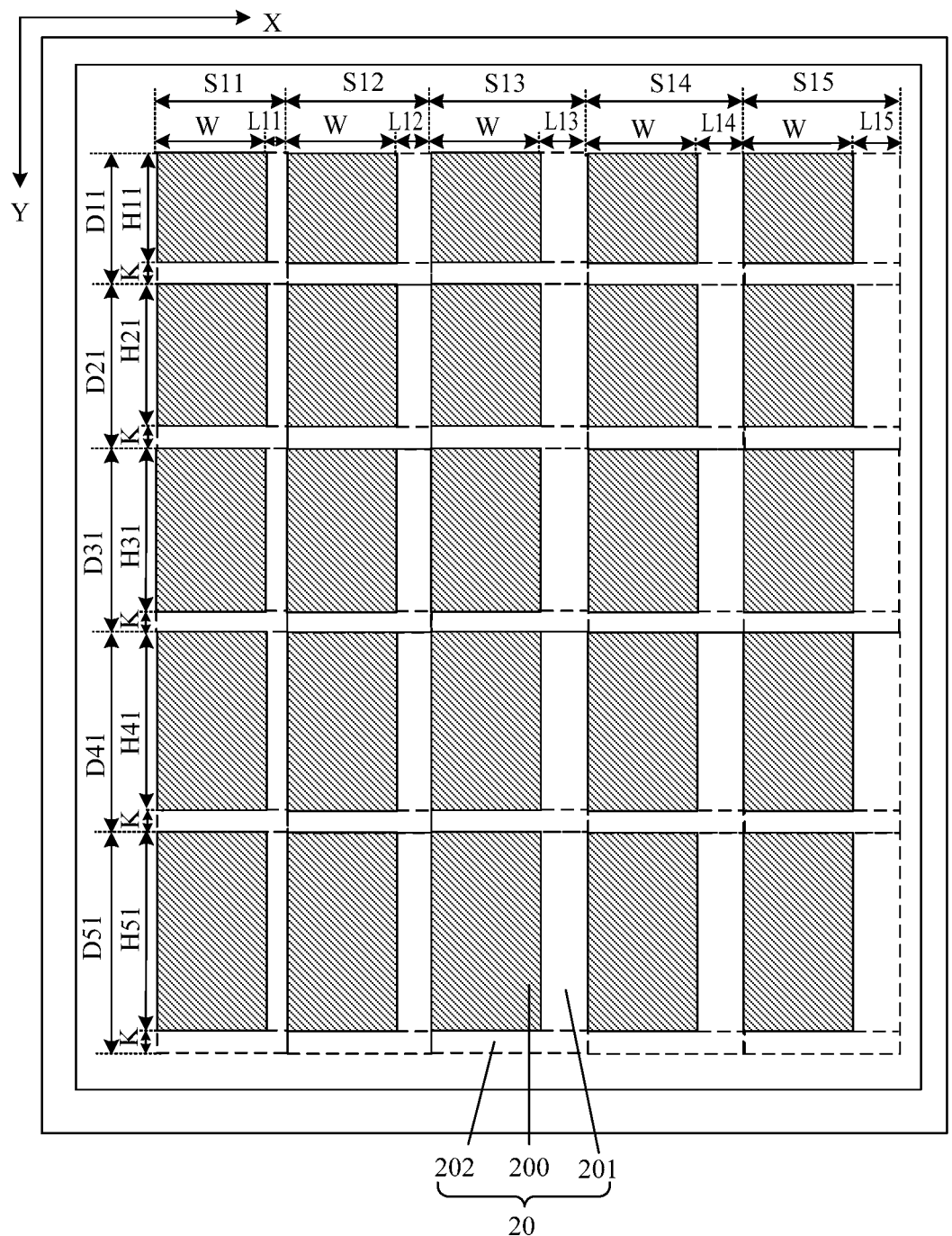
FIG. 8 is a schematic top view structural diagram of a transparent display panel according to another embodiment of the present disclosure.

As shown in FIG. 8, FIG. 8 is a schematic top view structural diagram of a transparent display panel according to another embodiment of the present disclosure. In any column of the display regions 20, the lengths of the second light transmissive regions 202 in the second direction Y keep constant, that is, the lengths K of any two second light transmissive regions 202 in the second direction Y are equal to each other, and the lengths of the non-transmissive regions 200 in the second direction Y change non-periodically. The lengths of the non-transmissive regions 200 in the second direction Y changing non-periodically includes that: the lengths of the non-transmissive regions 200 in the second direction Y are not equal to each other, that is $H11 \neq H21 \neq 31 \neq H41 \neq H51$.

Moreover, in any row of the display regions 20, the lengths W of any two of the non-transmissive regions 200 in the first direction X are equal to each other, and the lengths of the first light transmissive regions 201 in the first direction X change non-periodically, that is, the lengths of the first light transmissive regions 201 in the first direction X are not equal to each other, that is, $L11 \neq L12 \neq L13 \neq L14 \neq L15$.

In any row of the display regions 20, since the lengths of the first light transmissive regions 201 in the first direction X are not equal to each other, the multiple first light transmissive regions 201 are not equal in width. In any column of the display regions 20, the lengths of the non-transmissive regions 200 in the second direction Y are not equal to each other. Therefore, the multiple second light transmissive regions 202 are not equally spaced, such that the multiple columns of display regions 20 arranged along the first direction X cannot form a grating and the multiple rows of display regions 20 arranged along the second direction Y cannot form a grating, thereby eliminating or reducing the diffraction of light in the first direction X and the second direction Y, and eliminating or reducing the ghosting of images in the first direction X and the second direction Y.

Figure 9:
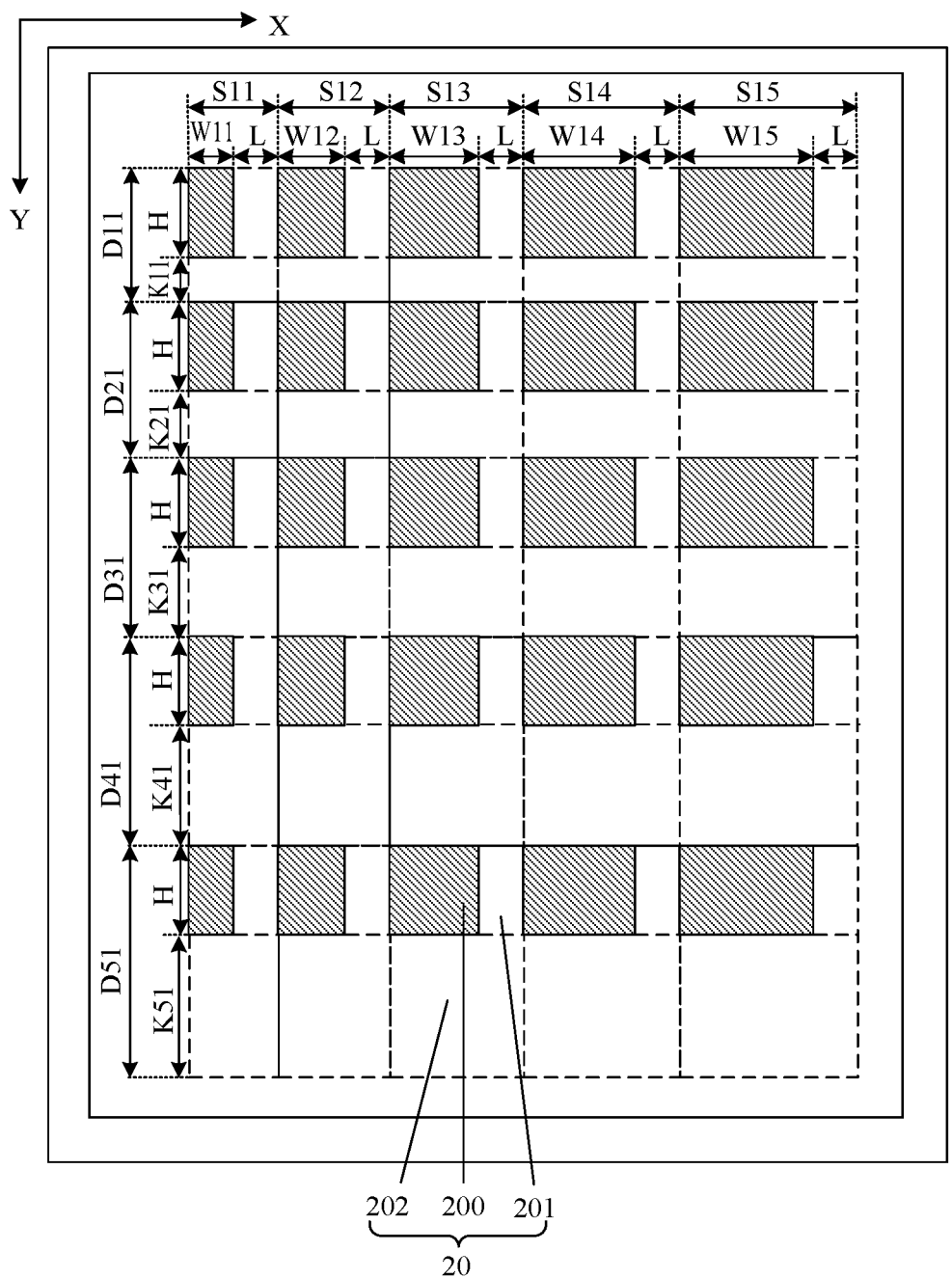
FIG. 9 is a schematic top view structural diagram of a transparent display panel according to another embodiment of the present disclosure.

As shown in FIG. 9, FIG. 9 is a schematic top view structural diagram of a transparent display panel according to another embodiment of the present disclosure. In any column of the display regions 20, the lengths H of the non-transmissive regions 200 in the second direction Y are equal to each other, and the lengths of the second light transmissive regions 202 in the second direction Y change non-periodically. The lengths of the second light transmissive regions 202 in the second direction Y changing non-periodically includes that: the lengths of the second light transmissive regions 202 in the second direction Y are not equal to each other, such as $K11 \neq K21 \neq W31 \neq W41 \neq W51$.

Moreover, in any row of the display regions 20, the lengths of the first light transmissive regions 201 in the first direction X keep constant, that is, the lengths L of any two first light transmissive regions 201 in the first direction X are equal to each other, the lengths of the non-transmissive regions 200 in the first direction X change non-periodically, that is, the lengths of the non-transmissive regions 200 in the first direction X are not equal to each other, that is, $W11 \neq W12 \neq W13 \neq W14 \neq W15$.

In any row of the display regions 20, since the lengths of the non-transmissive regions 200 in the first direction X are not equal to each other, the multiple first light transmissive regions 201 are not equally spaced. In any column of the display regions 20, the lengths of the second light transmissive regions 202 in the second direction Y are not equal to each other. Therefore, the multiple second light transmissive regions 202 are not equal in width, such that the multiple columns of display regions 20 arranged along the first direction X cannot form a grating and the multiple rows of display regions 20 arranged along the second direction Y cannot form a grating, thereby eliminating or reducing the diffraction of light in the first direction X and the second direction Y, and eliminating or reducing the ghosting of images in the first direction X and the second direction Y.

Figure 10:
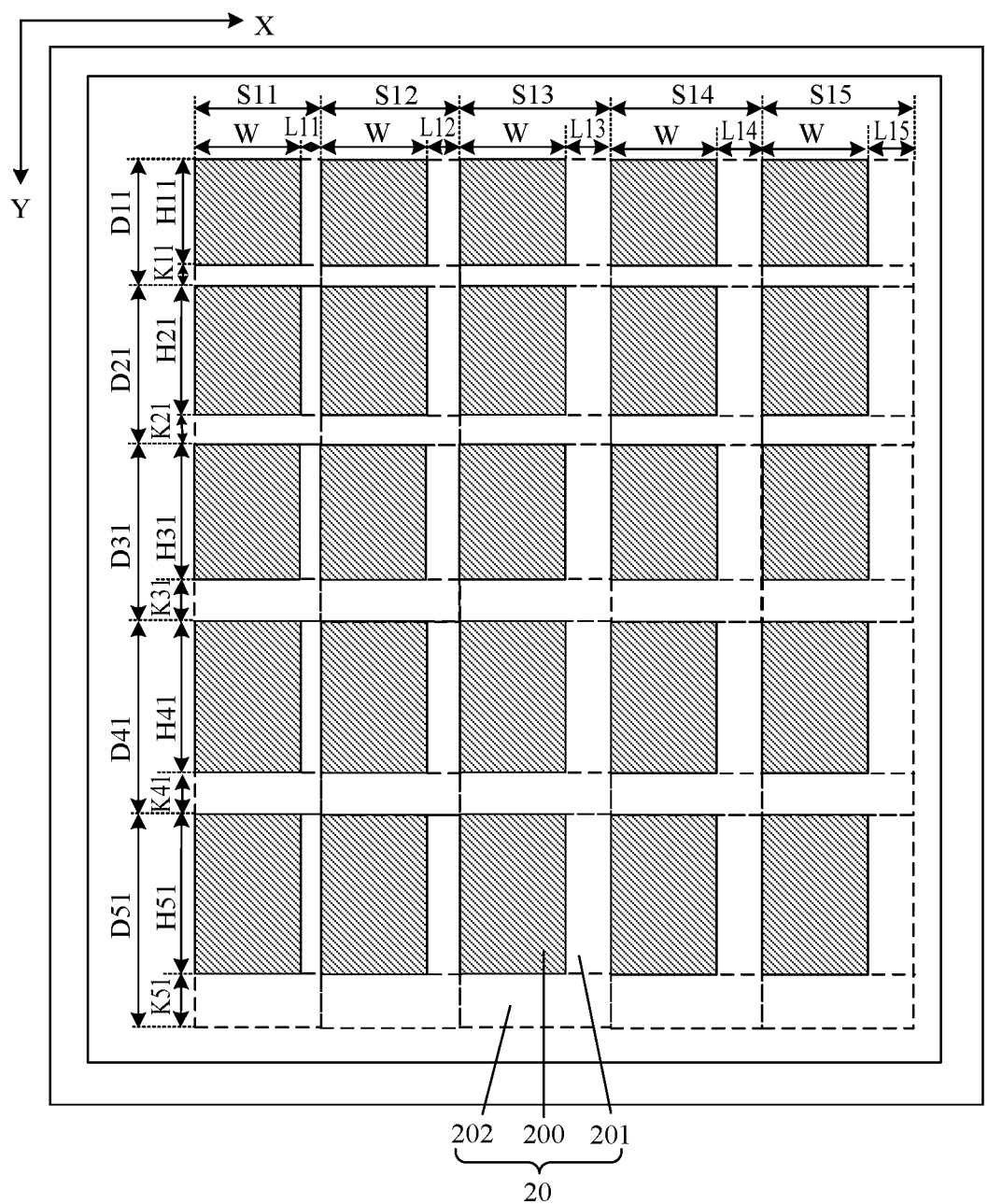
FIG. 10 is a schematic top view structural diagram of a transparent display panel according to another embodiment of the present disclosure.

As shown in FIG. 10, FIG. 10 is a schematic top view structural diagram of a transparent display panel according to another embodiment of the present disclosure. In any column of the display regions 20, the lengths of the non-transmissive regions 200 in the second direction Y change non-periodically, and the lengths of the second light transmissive regions 202 in the second direction Y change non-periodically. That is, the lengths of the non-transmissive regions 200 in the second direction Y are not equal to each other, that is, $H11 \neq H21 \neq H31 \neq H41 \neq H51$, and the lengths of the second light transmissive regions 202 in the second direction Y are not equal to each other, such as $K11 \neq K21 \neq K31 \neq K41 \neq K51$.

Moreover, in any row of the display regions 20, the lengths W of any two of the non-transmissive regions 200 in the first direction X are equal to each other, and the lengths of the first light transmissive regions 201 in the first direction X change non-periodically, that is, the lengths of the first light transmissive regions 201 in the first direction X are not equal to each other, that is, $L11 \neq L12 \neq L13 \neq L14 \neq L15$.

In any row of the display regions 20, since the lengths of the first light transmissive regions 201 in the first direction X are not equal to each other, the multiple first light transmissive regions 201 are not equal in width. In any column of the display regions 20, the lengths of the non-transmissive regions 200 in the second direction Y are not equal to each other, and the lengths of the second light transmissive regions 202 in the second direction Y are not equal to each other. Therefore, the multiple second light transmissive regions 202 are neither equally spaced nor equal in width, such that the multiple columns of display regions 20 arranged along the first direction X cannot form a grating and the multiple rows of display regions 20 arranged along the second direction Y cannot form a grating, thereby eliminating or reducing the diffraction of light in the first direction X and the second direction Y, and eliminating or reducing the ghosting of images in the first direction X and the second direction Y.

It should be noted that, in the embodiment of the present disclosure, in a case that the lengths of the non-transmissive regions 200 in the second direction Y are not equal to each other, a tolerance of lengths of any two of the non-transmissive regions 200 in the second direction Y is greater than an average of lengths of all the non-transmissive regions 200 of a same column in the second direction Y, among the column of the non-transmissive regions 200 arranged along the second direction Y. Further, in an embodiment, in a column of non-transmissive regions 200 arranged along the second direction Y, a tolerance of the lengths of any two non-transmissive regions 200 in the second direction Y is greater than 10% of the average length of all the non-transmissive regions 200 of a same column in the second direction Y. Therefore, the diffraction of the light in the second direction Y can be eliminated or reduced to the largest extent by limiting the length variations of the non-transmissive regions 200 in the second direction Y.

In a case that the lengths of the second light transmissive regions 202 in the second direction Y are not equal to each other, a tolerance of lengths of any two of the second light transmissive regions 202 in the second direction Y is greater than an average of lengths of all the second light transmissive regions 202 of a same column in the second direction Y, among the column of the display regions 20 arranged along the second direction Y. Further, in an embodiment, in a column of the display regions 20 arranged along the second direction Y, a tolerance of the lengths of any two of the second light transmissive regions 202 in the second direction Y is greater than 10% of the average length of all the second light transmissive regions 202 of a same column in the second direction Y. Therefore, the diffraction of the light in the second direction Y can be eliminated or reduced to the largest extent by limiting the length variations of the second light transmissive regions 202 in the second direction Y.

In another embodiment of the present disclosure, in a case that the lengths of the display regions 20 in the second direction Y are equal to each other among multiple display regions 20 arranged along the second direction Y, that is, D11=D21=D31=D41=D51=D, the second light transmissive regions 202 of any two adjacent display regions 20 are misaligned in the second direction Y among multiple display regions 20 arranged along the first direction X, thereby avoiding the formation of a grating in the second direction Y.

Figure 11:
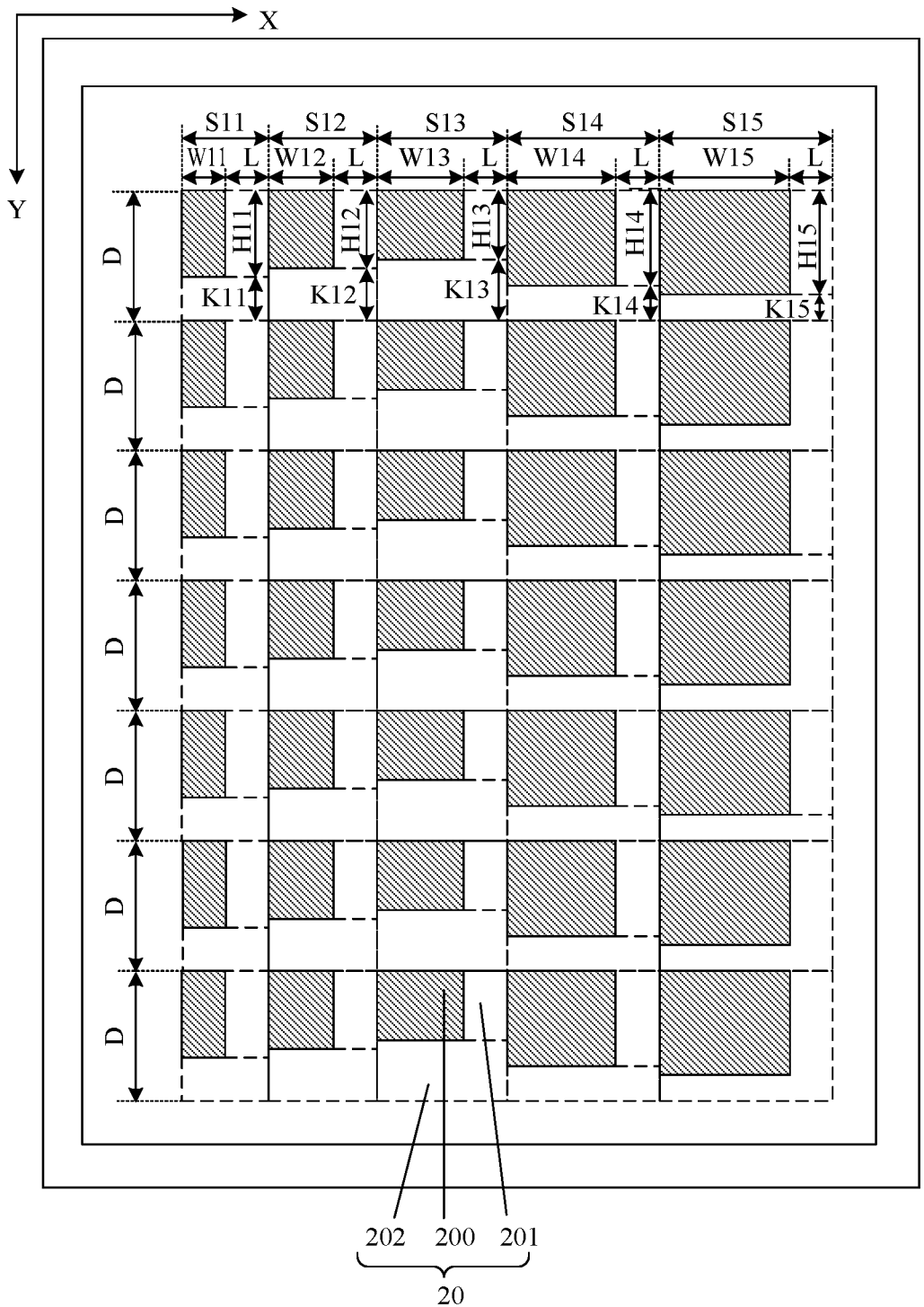
FIG. 11 is a schematic top view structural diagram of a transparent display panel according to another embodiment of the present disclosure.

As shown in FIG. 11, FIG. 11 is a schematic top view structural diagram of a transparent display panel according to another embodiment of the present disclosure. In any row of the display regions 20, the lengths of the display regions 20 in the second direction Y keep constant, that is, the lengths D of any two of the display regions 20 in the second direction Y are equal to each other. However, since the second light transmissive regions 202 of any two adjacent display regions 20 are misaligned in the second direction Y among any row of the display regions 20, the multiple second light transmissive regions 202 in a same row cannot form a strip-shaped light transmissive region, and the strip-shaped light transmissive regions in different rows cannot form parallel slits. Therefore, the multiple rows of the display regions 20 arranged along the second direction Y cannot form a grating, thereby eliminating or reducing the diffraction of light in the second direction Y, and eliminating or reducing the ghosting of images in the second direction Y.

In another embodiment of the present disclosure, in a case that the lengths of the display regions 20 in the second direction Y change non-periodically among multiple display regions 20 arranged along the second direction Y, the second light transmissive regions 202 of any two adjacent display regions 20 are misaligned in the second direction Y among multiple display regions 20 arranged along the second direction Y, thereby avoiding the formation of a grating in the second direction Y.

Figure 12:
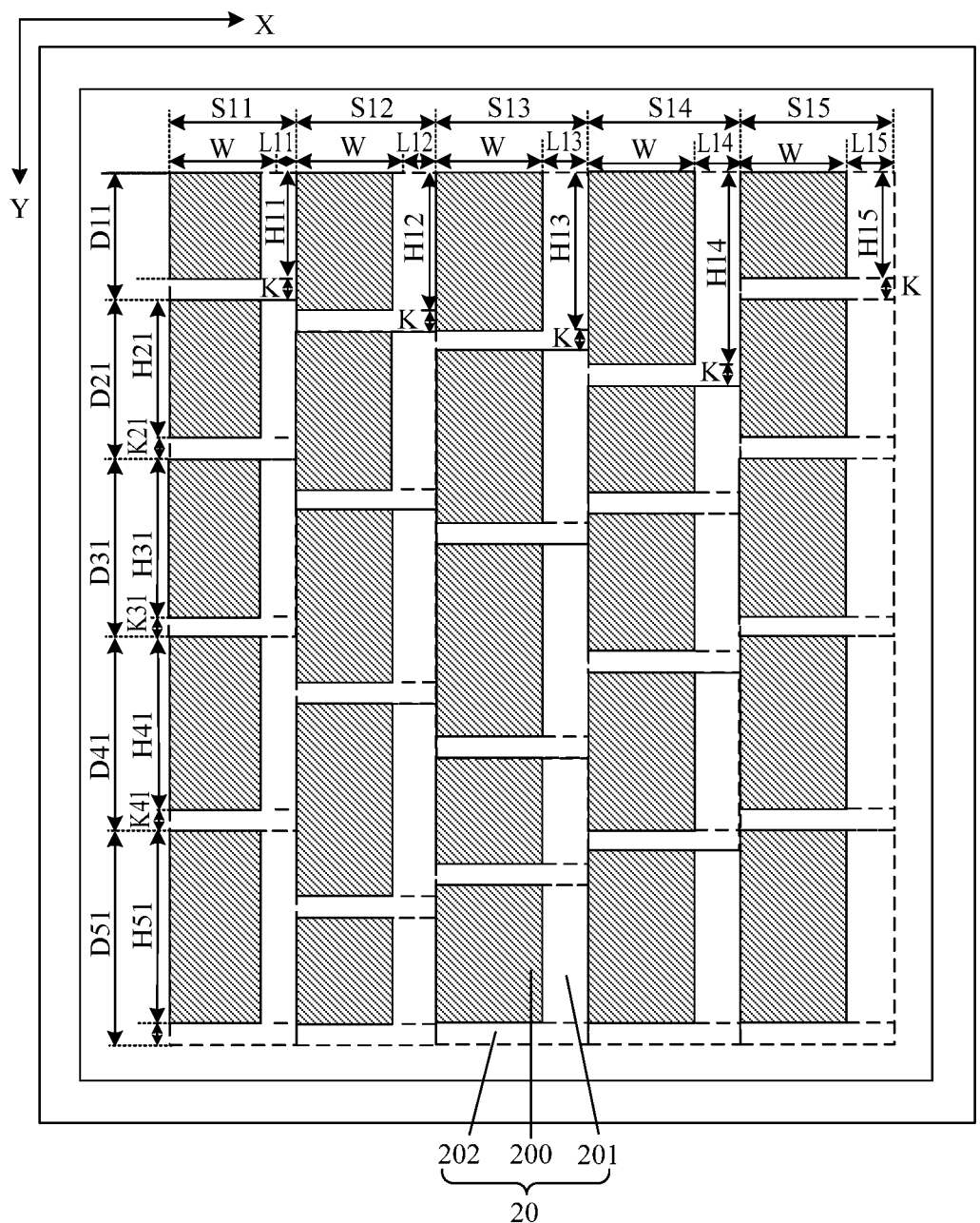
FIG. 12 is a schematic top view structural diagram of a transparent display panel according to another embodiment of the present disclosure.

As shown in FIG. 12, FIG. 12 is a schematic top view structural diagram of a transparent display panel according to another embodiment of the present disclosure. In any column of the display regions 20, the lengths of the display regions 20 in the second direction Y change non-periodically, that is, D11≠D21≠D31≠D41≠D51. Moreover, the second light transmissive regions 202 of any two adjacent display regions 20 are misaligned in the second direction Y among any row of the display regions 20, thereby avoiding the formation of multiple parallel slits with equal widths and equal spacing, preventing the multiple second light transmissive regions 202 in a same row from forming a strip-shaped light transmissive region, and preventing the strip-shaped light transmissive regions in different rows from forming parallel slits, and thus avoiding the formation of a grating in the second direction Y to the largest extent.

In any one of the above embodiments, the second light transmissive regions 202 of any two adjacent display regions 20 being misaligned in the second direction Y among multiple display regions 20 arranged along the first direction X includes that: in the multiple display regions 20 arranged along the first direction X, the lengths of the second light transmissive regions 202 in the second direction Y change non-periodically, and/or the lengths of the non-transmissive regions 200 in the second direction Y change non-periodically.

In any row of the display regions 20, in a case that the lengths of the second light transmissive regions 202 in the second direction Y change non-periodically, and/or the lengths of the non-transmissive regions 200 in the second direction Y change non-periodically, the second light transmissive regions 202 of any two adjacent display regions 20 are misaligned in the second direction Y among any row of the display regions 20, such that the multiple second light transmissive regions 202 of a same row cannot form a strip-shaped light transmissive region, and the strip-shaped light transmissive regions in different rows cannot form parallel slits. Therefore, the multiple columns of display regions 20 arranged along the second direction Y cannot form a grating, thereby eliminating or reducing the diffraction of light in the second direction Y, and eliminating or reducing the ghosting of images in the second direction Y.

As shown in FIG. 11, in any row of the display regions 20, the lengths of the non-transmissive regions 200 in the second direction Y change non-periodically, and the lengths of the second light transmissive regions 202 in the second direction Y change non-periodically, that is, the lengths of the non-transmissive regions 200 in the second direction Y are not equal to each other, such as, H11≠H12≠H13≠H14≠H15. Moreover, the lengths of the second light transmissive regions 202 in the second direction Y are not equal to each other, such as, K11≠K12≠K13≠K14≠K15.

In any row of the display regions 20, since the lengths of the non-transmissive regions 200 in the second direction Y are not equal to each other, and the lengths of the second light transmissive regions 202 in the second direction Y are not equal to each other, the second light transmissive regions 202 of any two adjacent display regions 20 are misaligned in the second direction Y among any row of the display regions 20. Therefore, the multiple rows of display regions 20 arranged along the second direction Y cannot form a grating, thereby eliminating or reducing the diffraction of light in the second direction Y.

As shown in FIG. 12, in any row of the display regions 20, the lengths K of the second light transmissive regions 202 in the second direction Y are equal to each other, and the lengths of the non-transmissive regions 200 in the second direction Y change non-periodically, that is, the lengths of the non-transmissive regions 200 in the second direction Y are not equal to each other, such as, H11≠H12≠H13≠H14≠H15.

In any row of the display regions 20, since the lengths of the non-transmissive regions 200 in the second direction Y are not equal to each other, the second light transmissive regions 202 of any two adjacent display regions 20 are misaligned in the second direction Y among any row of the display regions 20. Therefore, the multiple rows of display regions 20 arranged along the second direction Y cannot form a grating, thereby eliminating or reducing the diffraction of light in the second direction Y.

Figure 13:
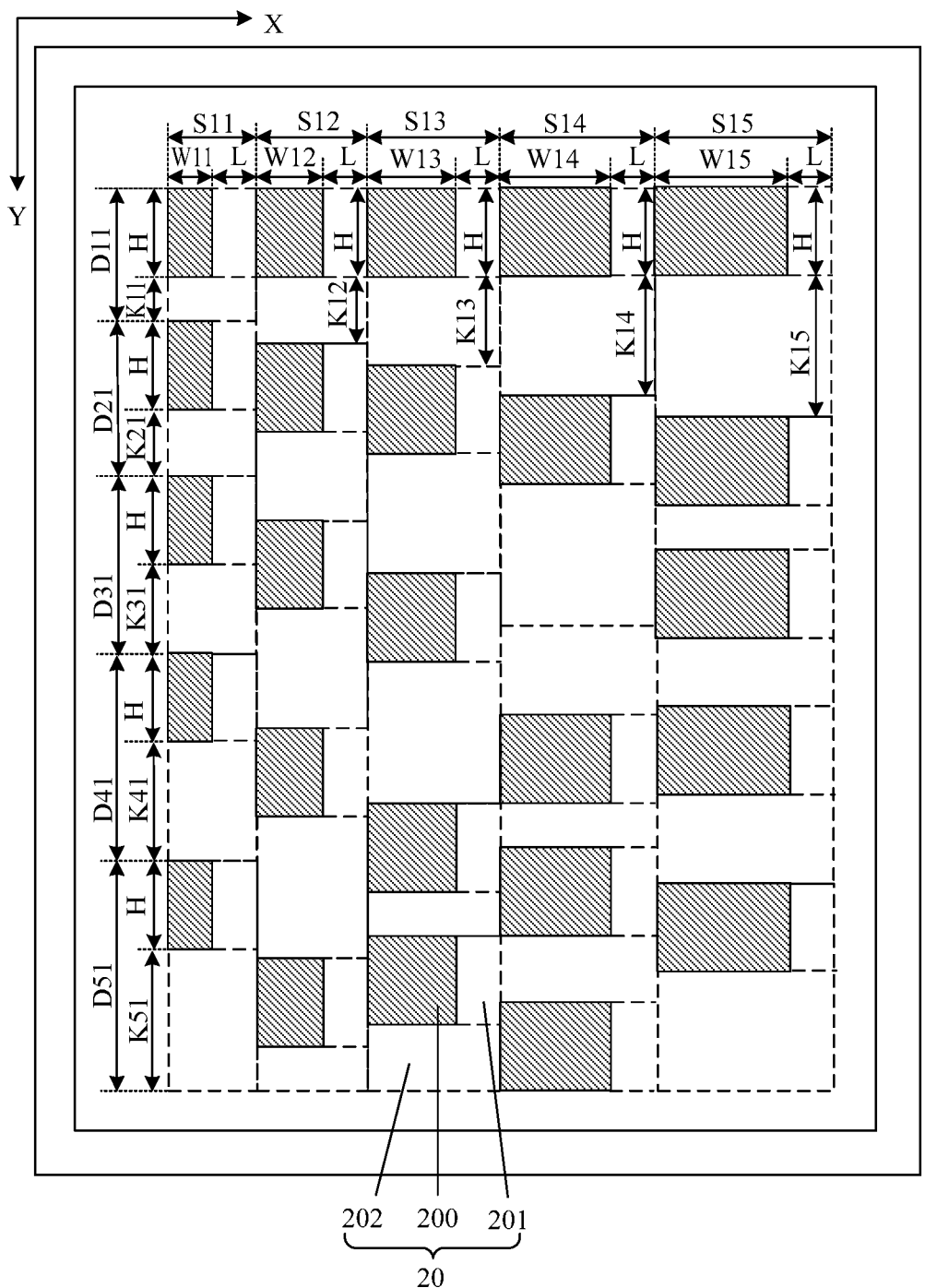
FIG. 13 is a schematic top view structural diagram of a transparent display panel according to another embodiment of the present disclosure.

As shown in FIG. 13, FIG. 13 is a schematic top view structural diagram of a transparent display panel according to another embodiment of the present disclosure. In any row of display regions 20, the lengths H of the non-transmissive regions 200 in the second direction Y are equal to each other, and the lengths of the second light transmissive regions 202 in the second direction Y change non-periodically, that is, the lengths of the second light transmissive regions 202 in the second direction Y are not equal to each other, that is, K11≠K12≠K13≠K14≠K15.

In any row of the display regions 20, since the lengths of the second light transmissive regions 202 in the second direction Y are not equal to each other, the second light transmissive regions 202 of any two adjacent display regions 20 are misaligned in the second direction Y among any row of the display regions 20. Therefore, the multiple rows of display regions 20 arranged along the second direction Y cannot form a grating, thereby eliminating or reducing the diffraction of light in the second direction Y.

It should be noted that, in a case that the lengths of the non-transmissive regions 200 in the second direction Y are not equal to each other, a tolerance of lengths of any two of the non-transmissive regions 200 in the second direction Y is greater than an average of lengths of all the non-transmissive regions 200 of a same column in the second direction Y, among a column of the non-transmissive regions 200 arranged along the second direction Y. Further, in an embodiment, in a column of non-transmissive regions 200 arranged along the second direction Y, a tolerance of the lengths of any two non-transmissive regions 200 in the second direction Y is greater than 10% of the average length of all the non-transmissive regions 200 of a same column in the second direction Y. Therefore, the diffraction of the light in the second direction Y can be eliminated or reduced to the largest extent by limiting the length variations of the non-transmissive regions 200 in the second direction Y.

In a case that the lengths of the second light transmissive regions 202 in the second direction Y are not equal to each other, a tolerance of lengths of any two of the second light transmissive regions 202 in the second direction Y is greater than an average of lengths of all the second light transmissive regions 202 of a same column in the second direction Y, among the column of the display regions 20 arranged along the second direction Y. Further, in an embodiment, in a column of the display regions 20 arranged along the second direction Y, a tolerance of the lengths of any two of the second light transmissive regions 202 in the second direction Y is greater than 10% of the average length of all the second light transmissive regions 202 of a same column in the second direction Y. Therefore, the diffraction of the light in the second direction Y can be eliminated or reduced to the largest extent by limiting the length variations of the second light transmissive regions 202 in the second direction Y.

It should be noted that, in the structures shown in FIG. 8, FIG. 10 and FIG. 12, the case that in any row of the display regions 20, the lengths W of any two of the non-transmissive regions 200 in the first direction X are equal to each other and the lengths of the first light transmissive regions 201 in the first direction X change non-periodically, is taken as an example. In the structures shown in FIG. 9, FIG. 11 and FIG. 13, the case that in any row of the display regions 20, the lengths L of any two of the first light transmissive region 201 in the first direction X are equal to each other and the lengths of the non-transmissive regions 200 in the first direction X change non-periodically, is taken as an example. The present disclosure is not limited thereto.

Figure 14:
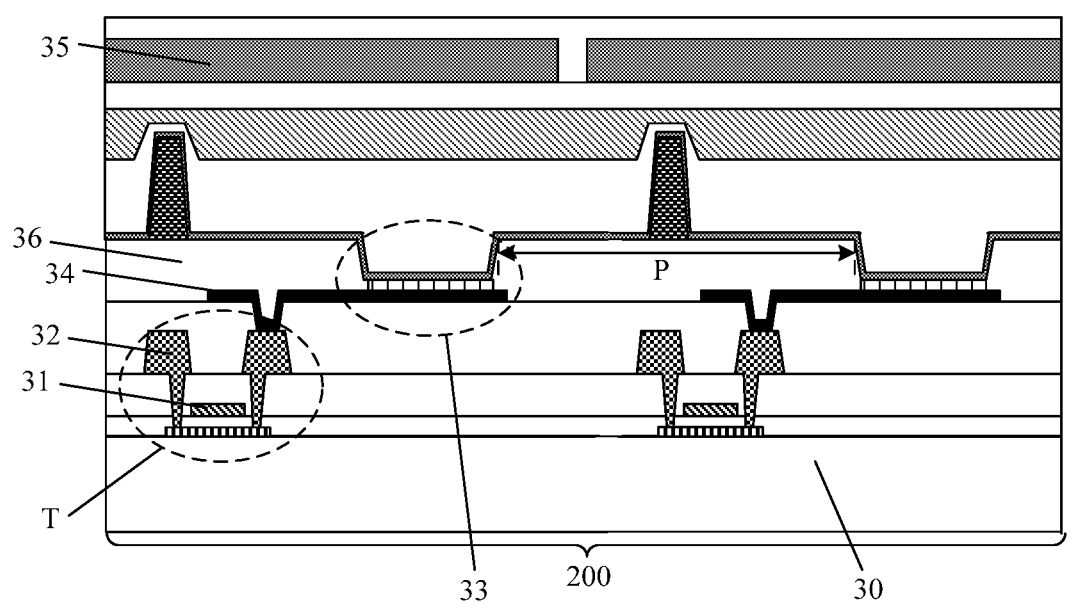
FIG. 14 is a schematic sectional structural diagram of a transparent display panel according to an embodiment of the present disclosure.

In any embodiment of the present disclosure, as shown in FIG. 14, FIG. 14 is a schematic sectional structural diagram of a transparent display panel according to an embodiment of the present disclosure. The non-transmissive region 200 of the transparent display panel includes a substrate 30, a pixel structure layer and an electrode layer sequentially arranged on the substrate 30. The pixel structure layer includes multiple gate lines 31, multiple data lines 32, multiple light emitting devices 33, and multiple driving circuits. The driving circuits are configured to drive the corresponding light emitting devices 33 to emit light. The driving circuit includes at least a thin film transistor T. The gate of the thin film transistor T is electrically connected to the gate line 31, the source of the thin film transistor T is electrically connected to the data line 32, and the drain of the thin film transistor T is connected to the pixel electrode 34. Practically, the transparent display panel further includes a touch electrode 35 to achieve a touch display function. In FIG. 14, the light emitting device 33 is an OLED for example, and the present disclosure is not limited thereto. In other embodiments, the light emitting device 33 may also be an LED or a micro LED.

It should be noted that the substrate 30 in the embodiment of the present disclosure may be a non-stretchable substrate such as a glass substrate, or a stretchable substrate. That is, the transparent display panel in the embodiment of the present disclosure may include a stretchable substrate and the light emitting device arranged on the stretchable substrate.

Figure 15:
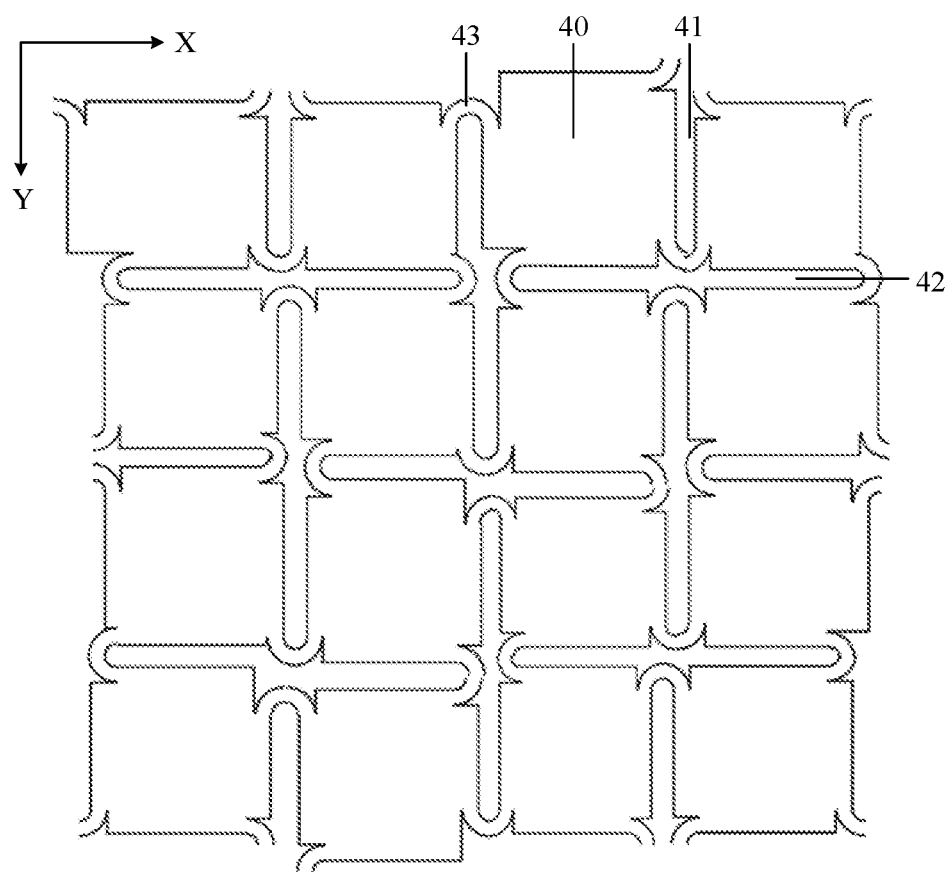
FIG. 15 is a schematic structural diagram of a stretchable substrate according to an embodiment of the present disclosure.

As shown in FIG. 15, FIG. 15 is a schematic structural diagram of a stretchable substrate according to an embodiment of the present disclosure. The stretchable substrate includes multiple island-shaped substrates 40 spaced on a plane in which the transparent display panel is located, a first gap 41 arranged between the island-shaped substrates 40 adjacent in the first direction X, and a second gap 42 arranged between the island-shaped substrates 40 adjacent in the second direction Y. Adjacent island-shaped substrates 40 are connected via a stretchable bridge 43. The island-shaped substrates 40 serve as the non-transmissive region 200, the first gap 41 serves as the first light transmissive region 201, and the second gap 42 serves as the second light transmissive region 202.

It should be noted that the length of the non-transmissive region 200, the length of the first transmissive region 201, and the length of the second transmissive region 202 in any one of the above embodiments refer to the length of the island-shaped substrate 40, the length of the first gap 41, and the length of the second gap 42 in a non-stretched state, respectively. According to the above embodiment, in the non-stretched state, the diffraction of the background light in the first direction X and/or the second direction Y can be eliminated or reduced, that is, the ghosting of images of the transparent display panel can be eliminated or reduced, which is more beneficial to optimize the viewing experience of the user.

Figure 16:
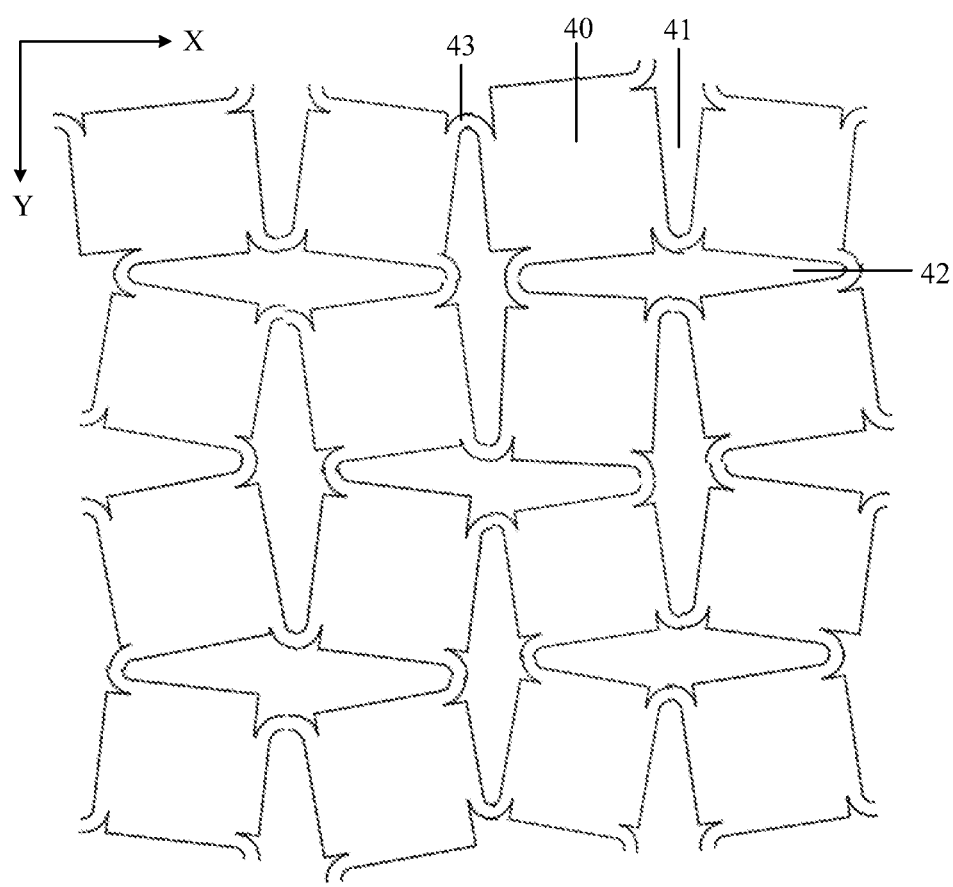
FIG. 16 is a schematic top view structural diagram of the stretchable display panel shown in FIG. 15 in a stretched state.

As shown in FIG. 16, FIG. 16 is a schematic top view structural diagram of the stretchable display panel shown in FIG. 15 in a stretched state. When the stretchable substrate is stretched, the stretchable bridge 43 is stretched to some extent and drives the island-shaped substrate 40 to move, thereby increasing the gap, such as the first gap 41 and the second gap 42, between the island-shaped substrates 40. Practically, the size and shape of each island-shaped substrate 40 keeps constant to protect the pixel structure and electrode structure of the island-shaped substrate 40 from damage.

Since the first gaps 41 and the second gaps 42 in a stretched state are not parallel slits with equal widths and equal spacing, the island-shaped substrate 40, the first gap 41, and the second gap 42 in the stretched state cannot form gratings in the first direction X and the second direction Y, that is, ghosting of the displayed images can be eliminated or reduced in either of the stretched state and the non-stretched state of the transparent display panel.

It should be noted that the island-shaped substrate 40 in the embodiment of the present disclosure is a part of the stretchable substrate, and the island-shaped substrate 40 is a real structure, rather than an island-shaped pattern. In the embodiment of the present disclosure, the stretchable substrate may be a substrate which is formed by cutting a flexible substrate, and includes independent island-shaped substrates 40 connected to each other via stretchable bridges 43. Certainly, the present disclosure is not limited thereto. The material of the stretchable substrate may be polyimide (PI), polycarbonate (PC) or polyethylene terephthalate (PET) and so on.

In addition, the stretchable bridge 43 may be a part of the stretchable substrate, that is, the stretchable bridge 43 and the island-shaped substrate 40 are both formed by cutting the flexible substrate, but the present disclosure is not limited thereto. In other embodiments, the stretchable bridge 43 may also be an elastic structure separately formed between the island-shaped substrates 40 in other manners, such as vapor deposition of a film layer.

It should also be noted that the gate line 31, the data line 32, the light emitting device 33, and the driving circuit and so on are all arranged on the island-shaped substrate 40, and connection portions of wirings between the adjacent island-shaped substrates 40 (such as the gate line 31 and the data line 32) are arranged on the stretchable bridge 43 to connect adjacent light emitting devices 33.

In an embodiment, at least one light emitting device 33 is arranged on one island-shaped substrate 40.

Figure 17:
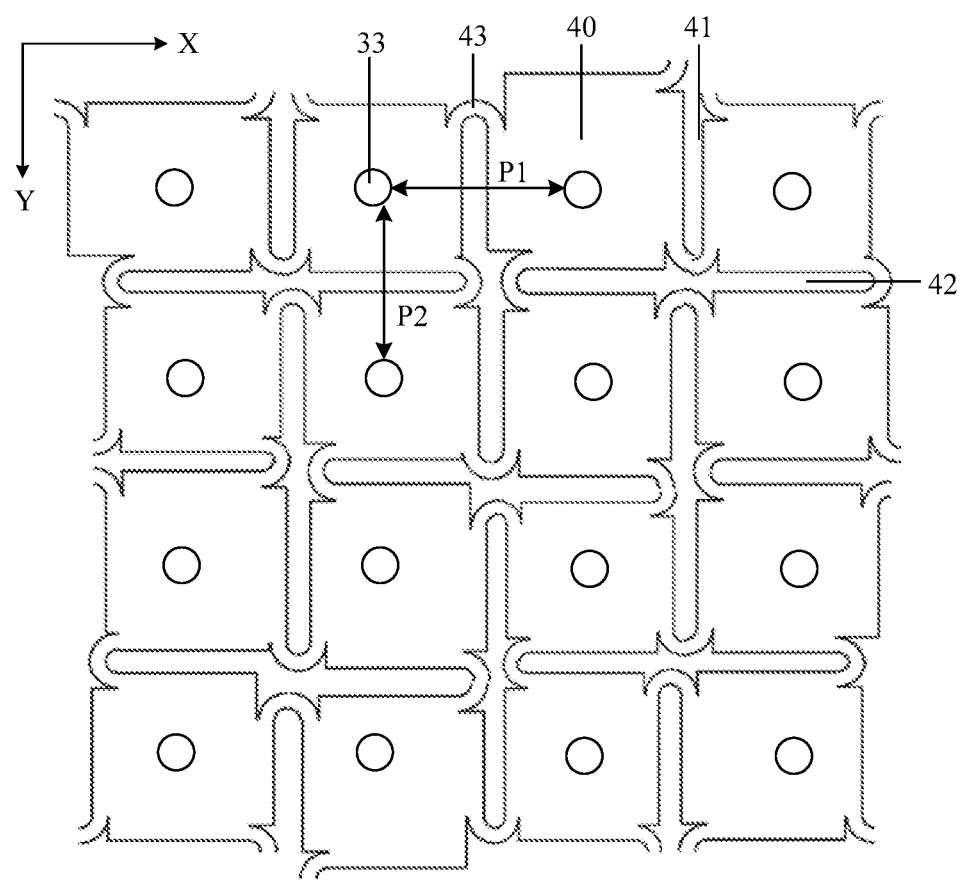
FIG. 17 is a schematic structural diagram of a stretchable substrate according to another embodiment of the present disclosure.

As shown in FIG. 17, FIG. 17 is a schematic structural diagram of a stretchable substrate according to another embodiment of the present disclosure. Only one light emitting device 33 is arranged on one island-shaped substrate 40.

Moreover, in the non-stretched state, a distance P1 between two light emitting devices 33 adjacent in the first direction X is equal to an average of the lengths in the first direction X for multiple display regions arranged along the first direction X. The length of the display region in the first direction X is equal to a sum of a length of the island-shaped substrate 40 in the first direction X and a length of the first gap 41 in the first direction X, such that the light emitting devices 33 are arranged non-periodically in the first direction X, thereby further reducing the diffraction of light in the first direction X, and eliminating or reducing the ghosting of images in the first direction X.

In the non-stretched state, a distance P2 between two adjacent light emitting devices 33 in the second direction Y is equal to an average of the lengths in the second direction Y for multiple display regions arranged along the second direction Y. The length of the display region in the second direction Y is equal to a sum of a length of the island-shaped substrate 40 in the second direction Y and a length of the second gap 42 in the second direction Y, such that the light emitting devices 33 are arranged non-periodically in the second direction Y, thereby further reducing the diffraction of light in the second direction Y, and eliminating or reducing the ghosting of images in the second direction Y.

It should be noted that, in the structure shown in FIG. 14, the distance between the two adjacent light emitting devices 33 refers to a distance P between open regions of two adjacent OLED pixel definition layers 36. Certainly, the present disclosure is not limited thereto. In other embodiments, the distance between the two adjacent light emitting devices 33 may be defined according to the actual structures of the light emitting devices 33. In general, the distance between two adjacent light emitting devices 33 refers to a distance between light emitting regions of the two adjacent light emitting devices 33.

Figure 18:
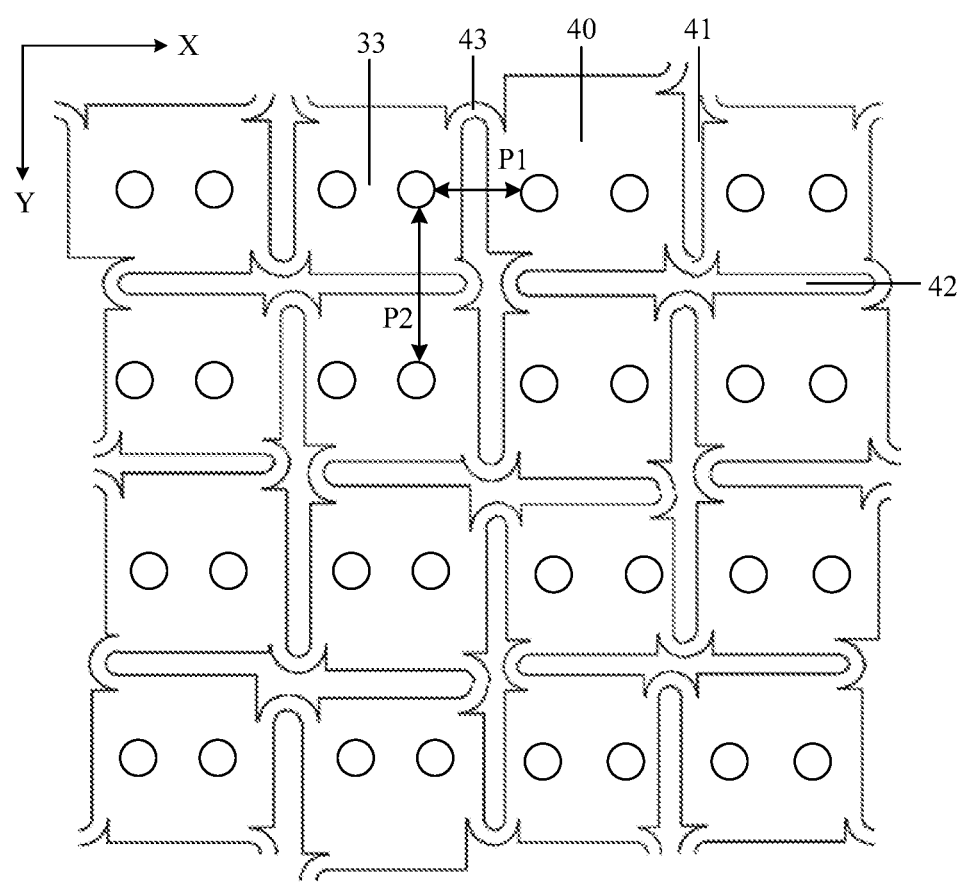
FIG. 18 is a schematic structural diagram of a stretchable substrate according to another embodiment of the present disclosure.

As shown in FIG. 18, FIG. 18 is a schematic structural diagram of a stretchable substrate according to another embodiment of the present disclosure. At least two light emitting devices 33 are arranged on one island-shaped substrate. In the non-stretched state, the length of the first light transmissive region, that is the first gap 41, in the first direction X is less than or equal to the distance P1 between two light emitting devices 33 which are adjacent in the first direction X and located on the same island-shaped substrate 40, and the length of the second light transmissive region, that is the second gap 42, in the second direction Y is less than or equal to the distance P2 between two light emitting devices 33 which are adjacent in the second direction Y and located on the same island-shaped substrate 40, such that a resolution is improved on basis of displaying complete images.

Certainly, the present disclosure is not limited thereto. In other embodiments, in the non-stretched state, the length of the first light transmissive region, that is the first gap 41, in the first direction X is greater than the distance P1 between the light emitting regions of two light emitting devices 33 which are adjacent in the first direction X and located on the same island-shaped substrate 40, and the length of the second light transmissive region, that is the second gap 42, in the second direction Y is greater than the distance P2 between the light emitting regions of two light emitting devices 33 which are adjacent in the second direction Y and located on the same island-shaped substrate 40, thereby further improving the resolution.

Figure 19:
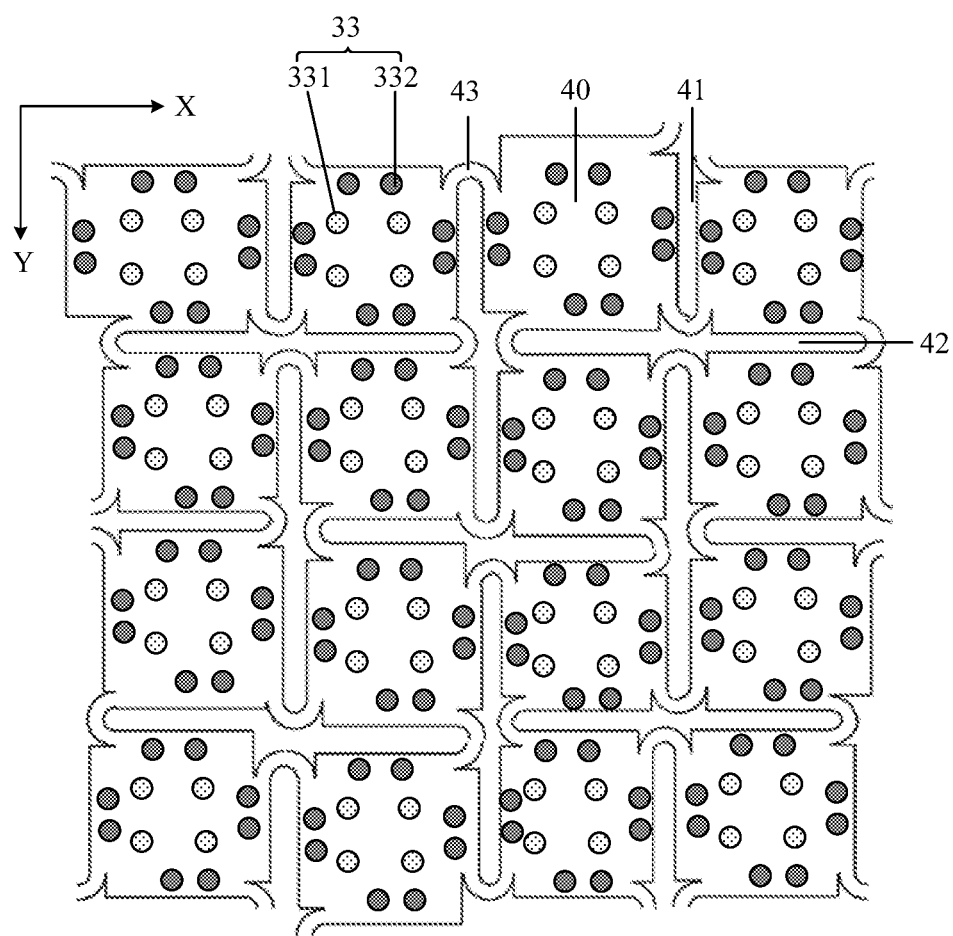
FIG. 19 is a schematic structural diagram of a stretchable substrate according to another embodiment of the present disclosure.

In an embodiment, as shown in FIG. 19, FIG. 19 is a schematic structural diagram of a stretchable substrate according to another embodiment of the present disclosure. The light emitting device 33 includes a first light emitting device 331 and a second light emitting device 332. Multiple first light emitting devices 331 are uniformly distributed on the stretchable substrate that is in the non-stretched state, and the second light emitting device 332 is arranged close to the first gap 41 or the second gap 42. In an embodiment, the multiple second light emitting devices 332 are non-uniformly distributed on the stretchable substrate that is in the non-stretched state.

Moreover, in the non-stretched state, the first light emitting devices 331 are turned on, and the second light emitting device 332 are turned off. In the stretched state, the first light emitting devices 331 are turned on, and a part of or all of the second light emitting devices 332 are turned on.

In the stretched state, since the first gap 41 and the second gap 42 are increased, the distance between the light emitting devices 33 located on the adjacent island-shaped substrate 40 is increased, resulting in that the brightness at the first gap 41 and the second gap 42 is reduced. In the stretched state, the brightness at the first gap 41 and the second gap 42 can be increased by turning on the first light emitting devices 331, and turning on a part of or all of the second light emitting devices 332, thereby improving the display effect, and avoiding the problems of picture warping and distortion caused by non-uniform distribution of the light emitting devices in the stretched state.

It should be noted that, the display panel provided in the embodiment of the present disclosure includes a drive chip. The drive chip is connected to the gate line 31, the data line 32 and the driving circuit, and is configured to drive the transparent display panel to operate. In the embodiment of the present disclosure, the drive chip is further configured to control the first light emitting device 331 and the second light emitting device 332 to be turned off or turned on based on a stretching state of the stretchable substrate.

It should be noted that, in the embodiment of the present disclosure, the proportion of the light transmissive region to the non-transmissive region may be adjusted flexibly. In a case that the proportion of the light transmissive region to the non-transmissive region is larger, the transmittance is higher, and the display panel is closer to the ideal transparent display panel.

Further, in a case that the substrate is a stretchable substrate, the transparency degree of the transparent display panel can be controlled by controlling the stretching degree of the stretchable substrate.

Figure 20:
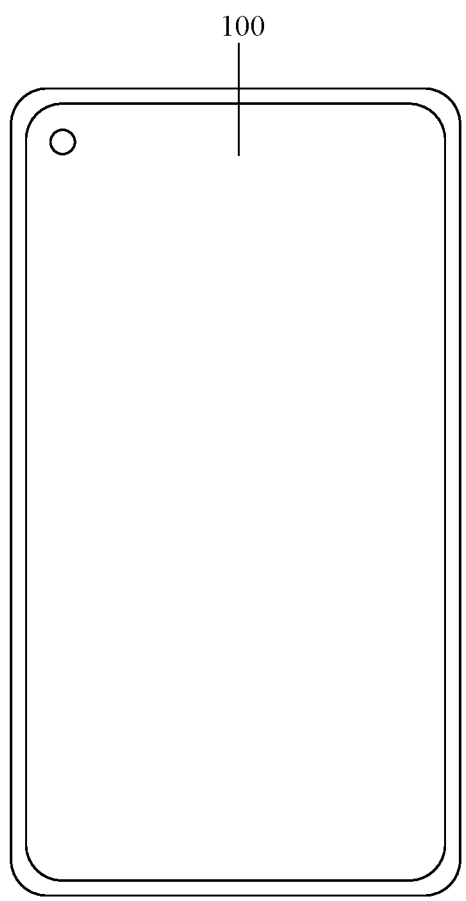
FIG. 20 is a schematic structural diagram of a transparent display device according to an embodiment of the present disclosure.

A transparent display device is further provided according to an embodiment of the present disclosure, including the transparent display panel provided in any one of the above embodiments. As shown in FIG. 20, FIG. 20 is a schematic structural diagram of a transparent display device according to an embodiment of the present disclosure. The display device 100 may be a mobile phone, a computer, a television, a smart wearable display device, etc, which is not limited in the embodiment of the present disclosure.

The invention claimed is:

1. A transparent display panel, comprising:
   a plurality of display regions arranged in an array along a first direction and a second direction, wherein the first direction and the second direction intersect with each other and are both parallel to a plane in which the transparent display panel is located;
   each of the display regions comprises a non-transmissive region, a first light transmissive region and a second light transmissive region; in a same display region, the non-transmissive region and the first light transmissive region are arranged sequentially in the first direction, and the non-transmissive region and the second light transmissive region are arranged sequentially in the second direction;
   lengths of the display regions in the first direction change non-periodically among a plurality of the display regions arranged along the first direction;
   and/or, the first light transmissive regions of any two adjacent display regions are misaligned in the first direction among a plurality of the display regions arranged along the second direction.

2. The transparent display panel according to claim 1, wherein lengths of the non-transmissive regions in the first direction change non-periodically, and/or lengths of the first light transmissive regions in the first direction change non-periodically, among a plurality of the display regions arranged along the first direction.

3. The transparent display panel according to claim 1, wherein lengths of the first light transmissive regions in the first direction change non-periodically, and/or lengths of the non-transmissive regions in the first direction change non-periodically, among a plurality of the display regions arranged along the second direction.

4. The transparent display panel according to claim 3, wherein lengths of the non-transmissive regions in the first direction changing non-periodically comprises that: lengths of the non-transmissive regions in the first direction are not equal to each other; and
   lengths of the first light transmissive regions in the first direction changing non-periodically comprises that: lengths of the first light transmissive regions in the first direction are not equal to each other.

5. The transparent display panel according to claim 4, wherein
   in a case that the lengths of the non-transmissive regions in the first direction are not equal to each other, a tolerance of lengths of any two of the non-transmissive regions in the first direction is greater than an average of lengths of all the non-transmissive regions of a same row in the first direction, among the row of non-transmissive regions arranged along the first direction; and
   in a case that the lengths of the first light transmissive regions in the first direction are not equal to each other, a tolerance of lengths of any two of the first light transmissive regions in the first direction is greater than an average of lengths of all the first light transmissive regions of a same row in the first direction, among the row of first light transmissive regions arranged along the first direction.

6. The transparent display panel according to claim 1, wherein lengths of the display regions in the second direction change non-periodically among a plurality of the display regions arranged along the second direction;
   and/or, the second light transmissive regions of any two adjacent display regions are misaligned in the second direction among a plurality of the display regions arranged along the first direction.

7. The transparent display panel according to claim 1, wherein lengths of the non-transmissive regions in the second direction change non-periodically, and/or lengths of the second light transmissive regions in the second direction change non-periodically, among a plurality of the display regions arranged along the second direction.

8. The transparent display panel according to claim 7, wherein lengths of the second light transmissive regions in the second direction change non-periodically, and/or lengths of the non-transmissive regions in the second direction change non-periodically, among a plurality of the display regions arranged along the first direction.

9. The transparent display panel according to claim 8, wherein
   lengths of the non-transmissive regions in the second direction changing non-periodically comprises that: lengths of the non-transmissive regions in the second direction are not equal to each other; and lengths of the second light transmissive regions in the second direction changing non-periodically comprises that: lengths of the second light transmissive regions in the second direction are not equal to each other.

10. The transparent display panel according to claim 9, wherein in a case that the lengths of the non-transmissive regions in the second direction are not equal to each other, a tolerance of lengths of any two of the non-transmissive regions in the second direction is greater than an average of lengths of all the non-transmissive regions of a same column in the second direction, among the column of non-transmissive regions arranged along the second direction; and in a case that the lengths of the second light transmissive regions in the second direction are not equal to each other, a tolerance of lengths of any two of the second light transmissive regions in the second direction is greater than an average of lengths of all the second light transmissive regions of a same column in the second direction.

11. The transparent display panel according to claim 1, wherein the non-transmissive region comprises a substrate, a pixel structure layer and an electrode layer sequentially arranged on the substrate; the pixel structure layer comprises a plurality of gate lines, a plurality of data lines, a plurality of light emitting devices, and a plurality of driving circuits, wherein the driving circuits are configured to drive the corresponding light emitting devices to emit light.

12. The transparent display panel according to claim 1, wherein the non-transmissive region has a square shape or an approximately square shape.

13. The transparent display panel according to claim 1, comprising a stretchable substrate and a light emitting device arranged on the stretchable substrate, wherein the stretchable substrate comprises a plurality of island-shaped substrates spaced on a plane in which the transparent display panel is located, a first gap arranged between the island-shaped substrates adjacent in the first direction, and a second gap arranged between the island-shaped substrates adjacent in the second direction; adjacent island-shaped substrates are connected via a stretchable bridge, the island-shaped substrates serve as the non-transparent region, the first gap serves as the first light transmissive region, and the second gap serves as the second light transmissive region.

14. The transparent display panel according to claim 13, wherein at least one of the light emitting devices is arranged on one of the island-shaped substrates.

15. The transparent display panel according to claim 14, wherein only one of the light emitting devices is arranged on one of the island-shaped substrates; and in a non-stretched state:

a distance between two adjacent light emitting devices in the first direction is equal to an average of lengths in the first direction for a plurality of the display regions arranged along the first direction; and a distance between two adjacent light emitting devices in the second direction is equal to an average of lengths in the second direction for a plurality of the display regions arranged along the second direction.

16. The transparent display panel according to claim 14, wherein at least two of the light emitting devices are arranged on one of the island substrates; and in a non-stretched state:

a length of the first light transmissive region in the first direction is less than or equal to a distance between two adjacent light emitting devices in the first direction, the two adjacent light emitting device are arranged on a same island-shaped substrate; and a length of the second light transmissive region in the second direction is less than or equal to a distance between two adjacent light emitting devices in the second direction, the two adjacent light emitting device are arranged on a same island-shaped substrate.

17. The transparent display panel according to claim 14, wherein at least two of the light emitting devices are arranged on one of the island-shaped substrates;

a length of the first light transmissive region in the first direction is greater than a distance between light emitting regions of two adjacent light emitting devices in the first direction, the two adjacent light emitting devices are arranged on a same island-shaped substrate; and a length of the second light transmissive region in the second direction is greater than a distance between light emitting regions of two adjacent light emitting devices in the second direction, the two adjacent light emitting devices are arranged on a same island-shaped substrate.

18. The transparent display panel according to claim 13, wherein the light emitting device comprises a first light emitting device and a second light emitting device, a plurality of the first light emitting devices are uniformly distributed on the stretchable substrate that is in a non-stretched state, and the second light emitting device is arranged close to the first gap or the second gap.

19. The transparent display panel according to claim 18, wherein in the non-stretched state, the first light emitting devices are turned on, the second light emitting devices are turned off; and in a stretched state, the first light emitting devices are turned on, and a part of or all of the second light emitting devices are turned on.

20. A transparent display device, comprising:

a transparent display panel, wherein the transparent display panel comprises a plurality of display regions arranged in an array along a first direction and a second direction, wherein the first direction and the second direction intersect with each other and are both parallel to a plane in which the transparent display panel is located;

each of the display regions comprises a non-transmissive region, a first light transmissive region and a second light transmissive region; in a same display region, the non-transmissive region and the first light transmissive region are arranged sequentially in the first direction, and the non-transmissive region and the second light transmissive region are arranged sequentially in the second direction;

lengths of the display regions in the first direction change non-periodically among a plurality of the display regions arranged along the first direction;

and/or, the first light transmissive regions of any two adjacent display regions are misaligned in the first direction among a plurality of the display regions arranged along the second direction.

* * * * *